(12) United States Patent
Yang et al.

(10) Patent No.: US 11,114,645 B2
(45) Date of Patent: Sep. 7, 2021

(54) POLARIZATION MEMBER AND DISPLAY DEVICE INCLUDING THE SAME

(71) Applicant: SAMSUNG DISPLAY CO., LTD., Yongin-si (KR)

(72) Inventors: Jungjin Yang, Seoul (KR); Myunghwan Kim, Seongnam-si (KR); Sunhwa Kim, Hwaseong-si (KR); Jieun Park, Busan (KR); Wonjun Song, Hwaseong-si (KR); Kwanhee Lee, Gyeonggi-do (KR); Dukjin Lee, Suwon-si (KR); Woosuk Jung, Cheonan-si (KR); Heeseong Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/581,267

(22) Filed: Apr. 28, 2017

(65) Prior Publication Data

US 2017/0317315 A1 Nov. 2, 2017

(30) Foreign Application Priority Data

Apr. 29, 2016 (KR) .................. 10-2016-0053283
Mar. 6, 2017 (KR) .................. 10-2017-0028481

(51) Int. Cl.
*H01L 51/52* (2006.01)
*G02B 5/20* (2006.01)
(Continued)

(52) U.S. Cl.
CPC .......... *H01L 51/5281* (2013.01); *G02B 5/208* (2013.01); *G02B 5/223* (2013.01);
(Continued)

(58) Field of Classification Search
None
See application file for complete search history.

(56) References Cited

U.S. PATENT DOCUMENTS 6,025,958 A 2/2000 Yamaoka et al.
9,045,670 B2 6/2015 Shitara et al.
(Continued)

FOREIGN PATENT DOCUMENTS

CN 1834726 9/2006
CN 103031071 4/2013
(Continued)

OTHER PUBLICATIONS

European Office Action dated Oct. 4, 2017.
(Continued)

*Primary Examiner* — Jack S Chen
(74) *Attorney, Agent, or Firm* — Kile Park Reed & Houtteman PLLC

(57) ABSTRACT

Provided is a display device including a display panel and a polarization member on the display panel, wherein the polarization member includes a polarizer, and a plurality of functional layers on at least one surface of the polarizer, wherein at least one of the plurality of functional layers includes a first light absorbing dye that absorbs light having a wavelength of greater than about 380 nm and equal to or less than about 450 nm.

31 Claims, 19 Drawing Sheets

(51) Int. Cl.
  *G02B 5/22*    (2006.01)
  *G02F 1/1335*  (2006.01)
  *G02B 5/30*    (2006.01)
  *G06F 3/041*   (2006.01)
  *H01L 27/32*   (2006.01)
  *G02F 1/1333*  (2006.01)

(52) U.S. Cl.
  CPC .......... *G02B 5/305* (2013.01); *G02B 5/3033* (2013.01); *G02F 1/133528* (2013.01); *G06F 3/0412* (2013.01); *H01L 27/322* (2013.01); *H01L 51/5284* (2013.01); *G02F 1/13338* (2013.01); *H01L 27/323* (2013.01); *H01L 27/3244* (2013.01)

(56) References Cited

U.S. PATENT DOCUMENTS

| | | |
|---|---|---|
| 9,122,362 B2 | 9/2015 | Park et al. |
| 9,195,099 B2 | 11/2015 | Kim et al. |
| 9,224,978 B2 | 12/2015 | Jung et al. |
| 9,450,207 B2 | 9/2016 | Lee et al. |
| 9,580,624 B2 | 2/2017 | Shitara et al. |
| 2006/0209239 A1 | 9/2006 | Lin |
| 2009/0242877 A1 | 10/2009 | Kondakov |
| 2013/0085215 A1* | 4/2013 | Shitara .............. C09J 7/00 524/100 |
| 2013/0163081 A1 | 6/2013 | Cho et al. |
| 2014/0160404 A1 | 6/2014 | Yamada et al. |
| 2014/0183462 A1 | 7/2014 | Lee et al. |
| 2014/0375935 A1 | 12/2014 | Yamada et al. |
| 2015/0102332 A1* | 4/2015 | Shin ............... H01L 51/5259 257/40 |
| 2015/0329747 A1 | 11/2015 | Cho et al. |
| 2015/0346408 A1* | 12/2015 | Mizutani ......... C09J 133/08 428/41.5 |
| 2015/0357597 A1 | 12/2015 | Wang |
| 2016/0085100 A1 | 3/2016 | Toyoshima et al. |
| 2016/0092005 A1 | 3/2016 | Toyoshima et al. |
| 2017/0077440 A1 | 3/2017 | Yoo et al. |
| 2017/0192145 A1 | 7/2017 | Furuki et al. |
| 2018/0149785 A1 | 5/2018 | Lee et al. |

FOREIGN PATENT DOCUMENTS

| | | |
|---|---|---|
| CN | 103163584 | 6/2013 |
| CN | 103869397 | 6/2014 |
| CN | 103926771 | 7/2014 |
| CN | 104170525 | 11/2014 |
| CN | 104576689 | 4/2015 |
| CN | 104854488 | 8/2015 |
| CN | 105210137 | 12/2015 |
| JP | 11-149015 | 6/1999 |
| JP | 2011-119223 | 6/2011 |
| JP | 2013-75978 | 4/2013 |
| JP | 2013-156975 | 8/2013 |
| JP | 2014-13266 | 1/2014 |
| JP | 2014-115468 | 6/2014 |
| JP | WO2016/052360 A1 | 8/2017 |
| JP | 2009209343 | 9/2017 |
| KR | 10-0927925 | 11/2009 |
| KR | 10-2011-0061317 | 6/2011 |
| KR | 20-2012-0006849 | 10/2012 |
| KR | 10-2013-0035963 | 4/2013 |
| KR | 10-2014-0039676 | 4/2014 |
| KR | 10-2015-0002033 | 1/2015 |
| KR | 10-1574024 | 11/2015 |
| KR | 10-2016-0096047 | 8/2016 |
| KR | 10-2018-0061484 | 6/2018 |

OTHER PUBLICATIONS

U.S. Office Action cited in copending U.S. Appl. No. 15/331,936 dated Sep. 21, 2017.
USPTO Office action dated Jun. 27, 2018, in U.S. Appl. No. 15/331,936.
USPTO Office action dated Apr. 5, 2018, in U.S. Appl. No. 15/331,936.
USPTO Office action dated Jul. 31, 2018 in U.S. Appl. No. 15/331,936.
Anonymous: "UV-328 25973-55-1, China", XP055562434, Retrieved from the Internet: URL:https://www.guidechem.com/tradelpdetail385967.html [retrieved on Feb. 27, 2019].
European Office Action dated Mar. 5, 2019.
Shiguang LV, "Handbook of plastics additives", Light Industry Press, Mar. 31, 1986, pp. 383-394.
Chinese Office Action with English translation for Chinese Patent or Application No. 201710292847.5, dated Mar. 24, 2021.
Writing group for "Handbook of synthetic material additives", "Handbook of synthetic material additives", Sep. 30, 1985, pp. 487-489, Second Edition.
Yaqing Feng, "Chemistry and technology of additives", Jun. 30, 1997, pp 132-134, Chemical Industry Press.

* cited by examiner

POLARIZATION MEMBER AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2016-0053283, filed on Apr. 29, 2016, and 10-2017-0028481, filed on Mar. 6, 2017, the entire contents of which are hereby incorporated by reference.

BACKGROUND

1. Field

Embodiments related to a polarization member and a display device including the same.

2. Description of the Related Art

The importance of display devices for visual information media has emerged in the information society. Display devices include, for example, liquid crystal displays (LCDs), plasma display panels (PDPs), organic light-emitting displays (OLEDs), field effect displays (FEDs), and electrophoretic display devices (EPDs).

SUMMARY

Embodiments are directed to a display device, including a display panel; and a polarization member on the display panel. The polarization member may include a polarizer, and a plurality of functional layers on at least one surface of the polarizer, at least one of the plurality of functional layers including a first light absorbing dye that absorbs light having a wavelength of greater than about 380 nm and equal to or less than about 450 nm.

The first light absorbing dye may include a benzotriazole, a benzophenone, a salicylic acid, a salicylate, a cyanoacrylate, a cinnamate, an oxanilide, a polystyrene, a polyferrocenylsilane, a methine, an azomethine, a triazine, a para-aminobenzoic acid, a cinnamic acid, a urocanic acid, or a combination thereof.

The plurality of functional layers may include at least one of a λ/4 retardation layer, a λ/2 retardation layer, a protective film, an antireflection layer, a hard coating layer, a brightness enhancement film, a first adhesive layer, or a surface treatment layer.

The first adhesive layer may include the first light absorbing dye.

The plurality of functional layers may include the λ/4 retardation layer, the λ/2 retardation layer, and the first adhesive layer, the λ/2 retardation layer and the first adhesive layer may be disposed between the polarizer and the λ/4 retardation layer, and the first adhesive layer may include the first light absorbing dye.

The first adhesive layer may be disposed between the λ/4 retardation layer and the λ/2 retardation layer.

The first adhesive layer may be disposed between the polarizer and the λ/2 retardation layer.

The functional layer including the first light absorbing dye may have a light transmittance in a wavelength range of greater than about 380 nm and equal to or less than about 400 nm of about 5% or less, and may have a light transmittance in a wavelength range of about 400 nm to about 410 nm of about 65% or less.

The functional layer including the first light absorbing dye may have a light transmittance in a wavelength range of about 410 nm to about 780 nm of about 65% to about 100%.

The display device may further include a second adhesive layer disposed between the display panel and the polarization member, the second adhesive layer including a second light absorbing dye that absorbs light having a wavelength of greater than about 380 nm and equal to or less than about 450 nm.

The second light absorbing dye may be the same as the first light absorbing dye.

Te second adhesive layer may have a light transmittance in a wavelength range of greater than about 380 nm and equal to or less than about 400 nm of about 5% or less, and may have a light transmittance in a wavelength range of about 400 nm to about 410 nm of about 65% or less.

The second adhesive layer may have a light transmittance in a wavelength range of about 410 nm to about 780 nm of about 65% to about 100%.

The display device may further include a touch sensing unit disposed between the display panel and the polarization member, and the second adhesive layer may be disposed between the display panel and the touch sensing unit.

The display device may further include a window member on the polarization member, and a third adhesive layer disposed between the polarization member and the window member, the third adhesive layer including a third light absorbing dye that absorbs light having a wavelength of greater than about 380 nm and equal to or less than about 450 nm.

The third light absorbing dye may be the same as the first light absorbing dye.

The third adhesive layer may have a light transmittance in a wavelength range of greater than about 380 nm and equal to or less than about 400 nm of about 5% or less, and may have a light transmittance in a wavelength range of about 400 nm to about 410 nm of about 65% or less.

The third adhesive layer may have a light transmittance in a wavelength range of about 410 nm to about 780 nm of about 65% to about 100%.

The display device may further include a touch sensing unit disposed between the polarization member and the window member. The third adhesive layer may include a first sub-adhesive layer disposed between the polarization member and the touch sensing unit and a second sub-adhesive layer disposed between the touch sensing unit and the window member, and at least one of the first sub-adhesive layer or the second sub-adhesive layer may include the third light absorbing dye.

The display device may further include a touch sensing unit disposed between the display panel and the polarization member. The touch sensing unit may be directly disposed on the display panel.

The display panel may include a first electrode, an organic layer that is on the first electrode and includes an emission layer, a second electrode on the organic layer, a capping layer on the second electrode, and an encapsulation layer on the capping layer. The capping layer may include a fourth light absorbing dye, which absorbs light having a wavelength of greater than about 380 nm and equal to or less than about 450 nm, or an organic material.

The encapsulation layer may include glass.

The capping layer may have a light transmittance in a wavelength range of about 400 nm to about 410 nm of about 65% or less.

The capping layer may have a light transmittance in a wavelength range of about 410 nm to about 780 nm of about 65% to about 100%.

Embodiments are also directed to a display device, including a display panel, and a polarization member on the display panel, the polarization member including a fifth light absorbing dye that absorbs light having a wavelength of greater than about 380 nm and equal to or less than about 450 nm.

The polarization member may have a light transmittance in a wavelength range of greater than about 380 nm and equal to or less than about 400 nm of about 5% or less, and may have a light transmittance in a wavelength range of about 400 nm to about 410 nm of about 65% or less.

The polarization member may have a light transmittance in a wavelength range of about 410 nm to about 780 nm of about 65% to about 100%.

The display device may further include a fourth adhesive layer on at least one surface of the polarization member, the fourth adhesive layer including a sixth light absorbing dye that absorbs light having a wavelength of greater than about 380 nm and equal to or less than about 450 nm.

The sixth light absorbing dye may be the same as the fifth light absorbing dye.

The fourth adhesive layer may have a light transmittance in a wavelength range of greater than about 380 nm and equal to or less than about 400 nm of about 5% or less, and may have a light transmittance in a wavelength range of about 400 nm to about 410 nm of about 65% or less.

The fourth adhesive layer may have a light transmittance in a wavelength range of about 410 nm to about 780 nm of about 65% to about 100%.

Embodiments are also directed to a display device, including: a display panel, the display panel including a first electrode, an organic layer that is on the first electrode and includes an emission layer, a second electrode on the organic layer, a capping layer on the second electrode, and an encapsulation layer on the capping layer, and a polarization member on the display panel, the polarization member including a polarizer, and a plurality of functional layers on at least one surface of the polarizer. At least one of the plurality of functional layers or the capping layer may include a seventh light absorbing dye that absorbs light having a wavelength of greater than about 380 nm and equal to or less than about 450 nm.

Embodiments are also directed to a display device, including a display panel, a polarization member and a touch sensing unit which are disposed on the display panel, a window member disposed on the polarization member and the touch sensing unit, and one or more adhesive layers disposed between the display panel and the window member. At least one of the one or more adhesive layers may include an eighth light absorbing dye which absorbs light having a wavelength range of greater than about 380 nm and equal to or less than about 450 nm.

The touch sensing unit may be disposed on the polarization member, and the one or more adhesive layers may include a first sub-adhesive layer disposed between the polarization member and the touch sensing unit; and a second sub-adhesive layer disposed between the touch sensing unit and the window member, and at least one of the first sub-adhesive layer or the second sub-adhesive layer may include the eighth light absorbing dye.

The polarization member may be disposed on the touch sensing unit, and the one or more adhesive layers may include a first sub-adhesive layer disposed between the display panel and the touch sensing unit; and a second sub-adhesive layer disposed between the polarization member and the window member, and at least one of the first sub-adhesive layer or the second sub-adhesive layer may include the eighth light absorbing dye.

The polarization member may be disposed on the touch sensing unit, the touch sensing unit may be directly disposed on the display panel, the one or more adhesive layers may include a first sub-adhesive layer disposed between the polarization member and the window member, and the first sub-adhesive layer may include the eighth light absorbing dye.

The adhesive layer including the eighth light absorbing dye among the one or more adhesive layers may have a light transmittance of about 5% or less in a wavelength range of greater than about 380 nm and equal to or less than about 400 nm, a light transmittance of about 65% or less in a wavelength range of greater than about 400 nm and equal to or less than about 410 nm, and a light transmittance of greater than about 65% to less than about 100% in a wavelength range of greater than about 410 nm and equal to or less than about 780 nm.

The display panel may include a first electrode, an organic layer which is disposed on the first electrode and including an emission layer. a second electrode disposed on the organic layer; and a capping layer disposed on the second electrode. The capping layer may include a ninth light absorbing dye which absorbs light having a wavelength range of greater than about 380 nm and equal to or less than about 450 nm.

BRIEF DESCRIPTION OF THE DRAWINGS

Features will become apparent to those of skill in the art by describing in detail example embodiments with reference to the attached drawings in which.

Figure 19:
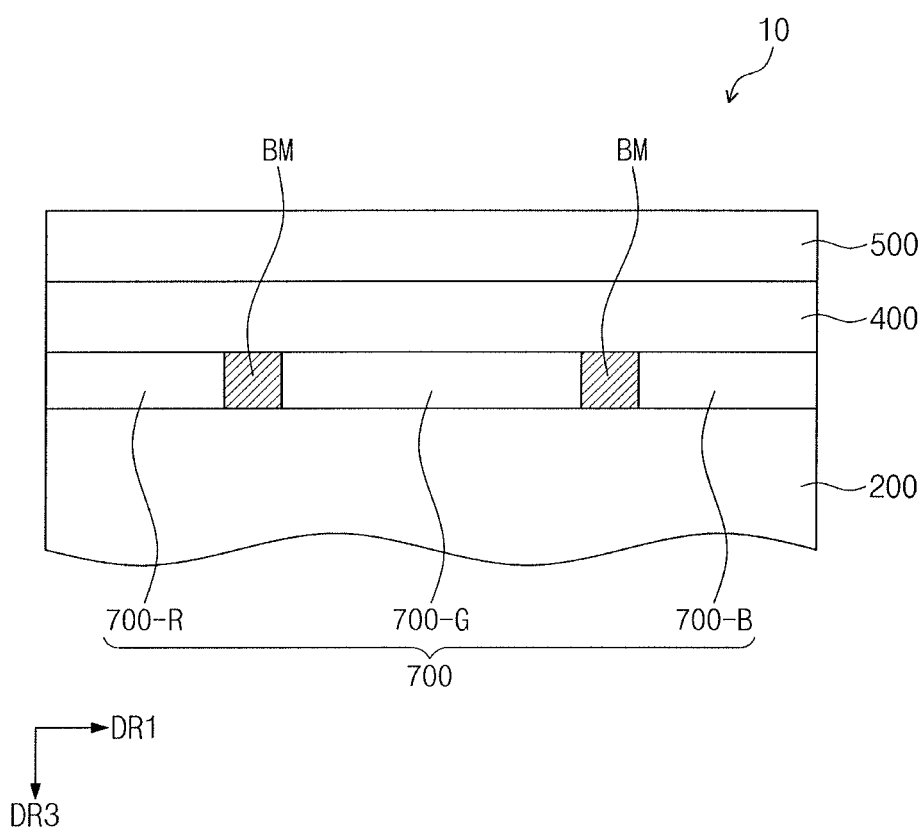
Figure 20:
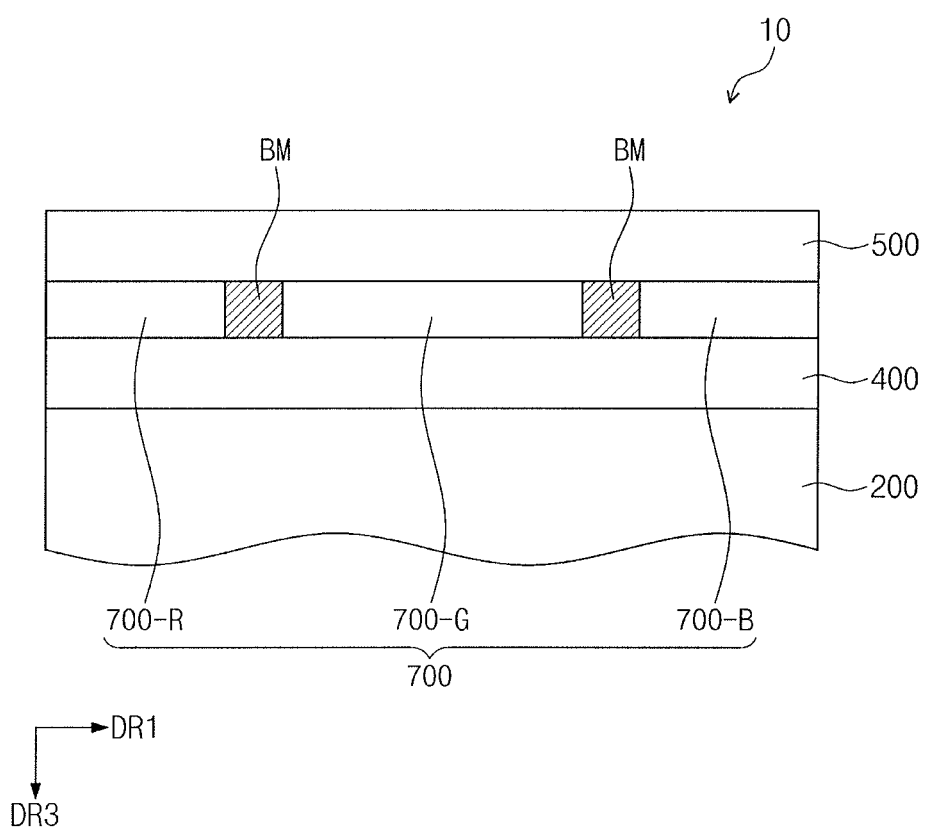

Comparative Example 1;

FIG. 19 is a schematic cross-sectional view illustrating a display device according to an example embodiment; and FIG. 20 is a schematic cross-sectional view illustrating a display device according to an example embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that, although the terms first, second, etc., may be used herein to describe various elements, these elements should not be limited by these terms. These terms are only used to distinguish one element from another element. For example, a first element could be termed a second element, and, similarly, a second element could be termed a first element, without departing from the scope of the present disclosure. The terms of a singular form may include plural forms unless referred to the contrary.

It will be further understood that the terms "includes" and/or "including", when used in this specification, specify the presence of stated features, integers, steps, operations, elements, components, or combinations thereof, but do not preclude the presence or addition of one or more other features, integers, steps, operations, elements, components, or combinations thereof. Also, it will be understood that when an element such as a layer, film, region, or substrate is referred to as being "on" another element, it can be directly on the other element or intervening elements may also be present therebetween. When an element such as a layer, film, region, or substrate is referred to as being "under" another element, it may be directly under the other element or intervening elements may also be present.

As used herein, the term "dye" does not exclude materials such as pigments.

Hereinafter, a display device according to an example embodiment will be described.

Figure 1:
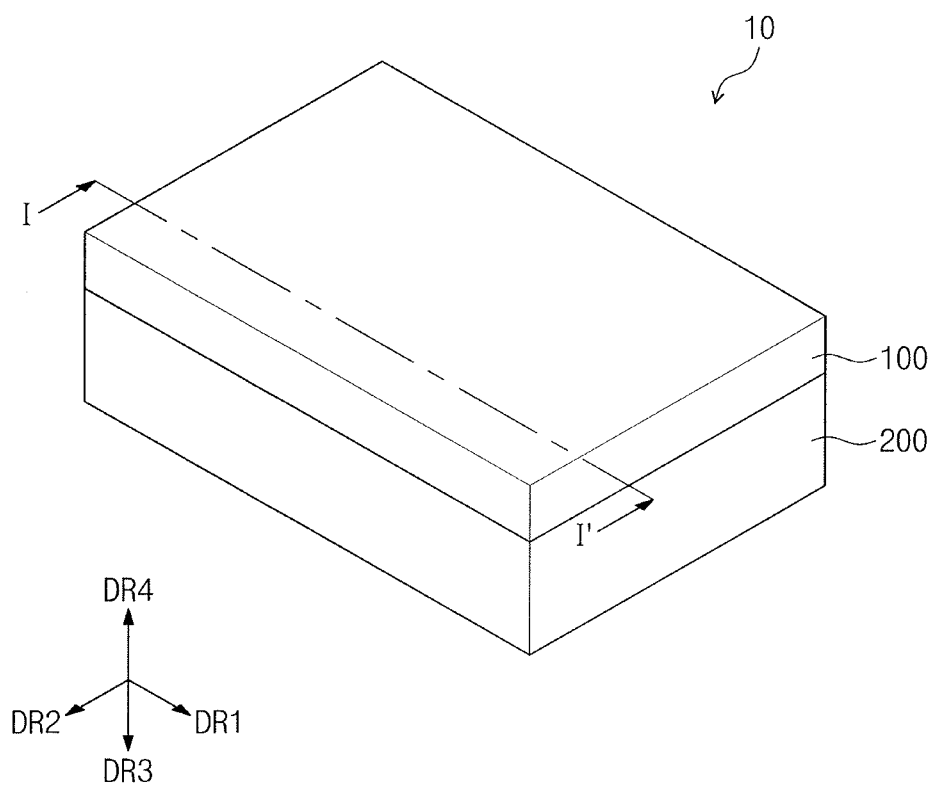
FIG. 1 is a perspective view schematically illustrating a display device according to an example embodiment.
Figure 2:
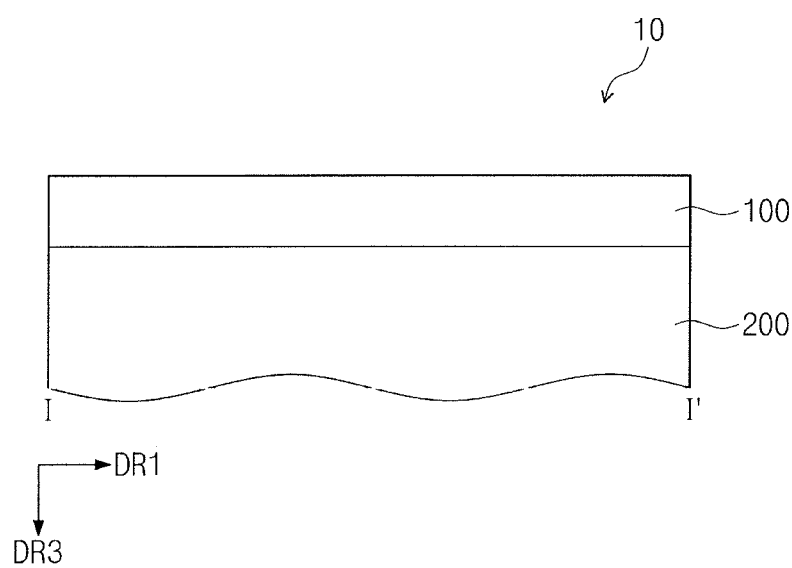
FIG. 2 is a schematic cross-sectional view taken along line I-I' of FIG. 1.

FIG. 1 is a schematic perspective view of a display device according to an example embodiment. FIG. 2 is a schematic cross-sectional view taken along line I-I' of FIG. 1.

Referring to FIGS. 1 and 2, a display device 10 according to an example embodiment includes a polarization member 100 and a display panel 200. The polarization member 100 is disposed on the display panel 200.

Figure 3:
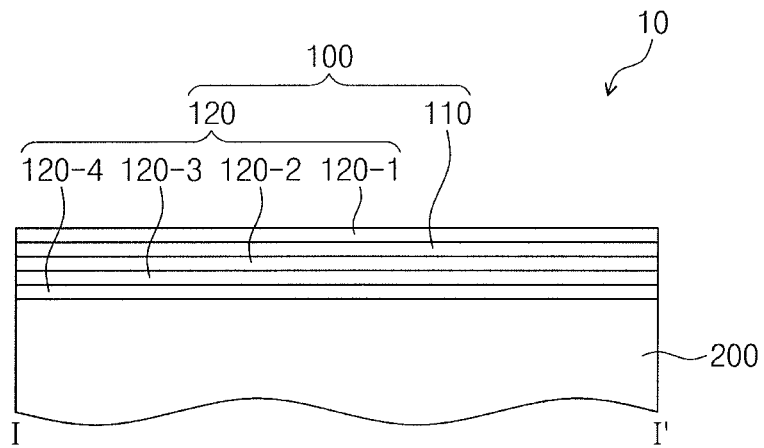
FIG. 3 is a cross-sectional view illustrating a portion of FIG. 2 in more detail.
Figure 4:
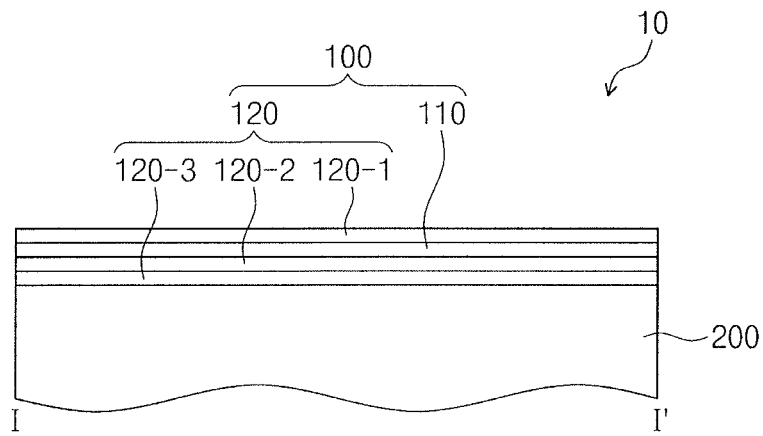
FIG. 4 is a cross-sectional view illustrating a portion of FIG. 2 in more detail.

FIGS. 3 and 4 are cross-sectional views illustrating the polarization member of FIG. 2 in more detail.

Referring to FIGS. 1 to 4, the polarization member 100 includes a polarizer 110 and a plurality of functional layers 120 disposed on at least one surface of the polarizer 110.

The polarizer 110 may be a polyvinyl alcohol (PVA)-based polarizer. For example, the polarizer 110 may be the polyvinyl alcohol-based polarizer in which iodine and/or a dichroic dye is dyed, etc.

The plurality of functional layers 120 is disposed on at least one surface of the polarizer 110. The plurality of functional layers 120 may include, for example, a retardation film, a protective film, an antireflection layer, a hard coating layer, a brightness enhancement film, a first adhesive layer, a surface treatment layer, or a combination thereof, etc. For example, the first adhesive layer may include a first light absorbing dye.

The retardation film may include a λ/4 retardation layer and a λ/2 retardation layer. The λ/4 retardation layer may be an optical layer that delays a phase of provided light by λ/4. For example, in a case in which a wavelength of the provided light is about 550 nm, light passing through the λ/4 retardation layer may have a retardation value of about 137.5 nm. Also, the λ/4 retardation layer may have an optical anisotropy and may change a polarization state of light incident on the λ/4 retardation layer. In an embodiment, the λ/4 retardation layer may be an A-Plate.

The λ/2 retardation layer may be an optical layer that delays a phase of provided light by λ/2. For example, in a case in which a wavelength of the provided light is about 550 nm, light passing through the λ/2 retardation layer may have a retardation value of about 275 nm. Also, the λ/2 retardation layer may change a polarization state of light incident on the λ/2 retardation layer.

Any one of a retardation value of the λ/4 retardation layer in a thickness direction or a retardation value of the λ/2 retardation layer in a thickness direction may have a positive value and the other one may have a negative value. For example, the λ/4 retardation layer may be a positive A-Plate (posi A-Plate) and the λ/2 retardation layer may be a negative A-Plate (nega A-Plate).

Referring to FIG. 3, the functional layers 120 may include a first functional layer 120-1 disposed on one surface of the polarizer 110. The functional layers may further include a second functional layer 120-2, a third functional layer 120-3, and a fourth functional layer 120-4 sequentially disposed on another surface of the polarizer 110. In another implementation, an additional functional layer may be further included, or some of the functional layers may be omitted. For example, referring to FIG. 4, the functional layers 120 may include the first functional layer 120-1 disposed on one surface of the polarizer 110, and the second functional layer 120-2 and the third functional layer 120-3 sequentially disposed on another surface of the polarizer 110.

Figure 5:
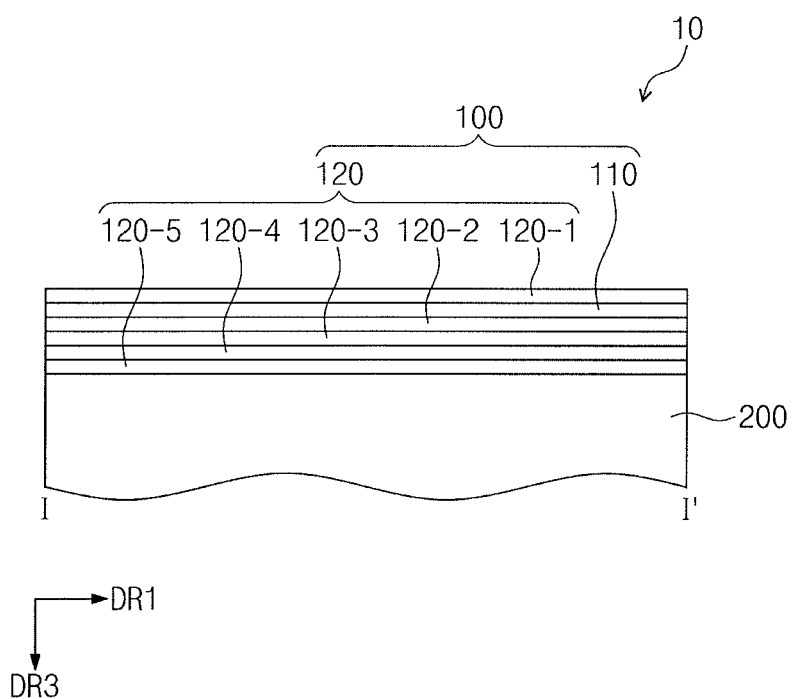
FIG. 5 is a cross-sectional view illustrating a portion of FIG. 2 in more detail.

Referring to FIG. 5, the functional layers 120 may include the λ/4 retardation layer, the λ/2 retardation layer, and the first adhesive layer which are disposed under the polarizer 110. For example, the functional layers 120 may include a protective film 120-2 disposed on a bottom surface of the polarizer 110, a λ/2 retardation layer 120-3 disposed under the protective film 120-2, a first adhesive layer 120-4 disposed under the λ/2 retardation layer 120-3, and a λ/4 retardation layer 120-5 disposed under the first adhesive layer 120-4. For example, the first adhesive layer 120-4 may be disposed on the λ/2 retardation layer 120-3 and the λ/4 retardation layer 120-5 and may include the first light absorbing dye. As another example, the functional layers 120 may include the λ/2 retardation layer 120-3 disposed at the bottom surface of the polarizer 110, a first adhesive layer 120-2 disposed between the polarizer 110 and the λ/2 retardation layer 120-3, a sub-adhesive layer 120-4 disposed under the λ/2 retardation layer 120-3, and the λ/4 retardation layer 120-5 disposed on the sub-adhesive layer 120-4. The first adhesive layer 120-2 may include the first light absorbing dye.

According to the present example embodiment, the polarization member 100 includes a light absorbing dye that absorbs ultraviolet light and a portion of visible light. In an example embodiment, the light absorbing dye absorbs light having a wavelength of greater than about 380 nm and equal to or less than about 450 nm. In an example embodiment, the light absorbing dye is substantially transmissive above 450 nm.

In an example embodiment, at least one of the plurality of functional layers 120 includes a first light absorbing dye that absorbs ultraviolet light and a portion of visible light. For example, the at least one of the plurality of functional layers 120 may include the first light absorbing dye that absorbs light having a wavelength of greater than about 380 nm and equal to or less than about 450 nm.

In an example embodiment, the at least one functional layer of the plurality of functional layers 120 included in the polarization member 100 absorbs the ultraviolet light and the portion of visible light. Thus, an amount of the ultraviolet light and the portion of visible light that are incident on the display panel 200 may be reduced and, as a result, degradation of the display panel 200 due to the ultraviolet light and the portion of visible light may be prevented.

A display device may be configured to prevent degradation of the display device due to ultraviolet light by including a polarization member that absorbs ultraviolet light having a wavelength range of about 380 nm or less. However, ultraviolet light having a wavelength range of about 380 nm or more and a portion of visible light by not be absorbed and, as such, degradation of the display device may occur. Thus, in the display according to an example embodiment, the functional layer includes the first light absorbing dye that absorbs light having a wavelength of greater than about 380 nm and equal to or less than about 450 nm.

In the display device 10 according to an example embodiment, the polarization member 100 absorbs light having a wavelength of greater than about 380 nm and equal to or less than about 450 nm, which may help suppress changes in color temperature of the display device due to ultraviolet light and a portion of visible light. In a case in which the wavelength of greater than about 450 nm is significantly absorbed, changes in color temperature may occur and, if light in a blue wavelength range is absorbed, blue light efficiency of the display device may be reduced.

In an example embodiment, the dye that absorbs light having a wavelength of greater than about 380 nm and equal to or less than about 450 mu denotes a dye or combination of dyes having a maximum absorption wavelength of greater than about 380 nm and equal to or less than about 450 nm.

The first light absorbing dye may be or include, for example, a benzotriazole, a benzophenone, a salicylic acid, a salicylate, a cyanoacrylate, a cinnamate, an oxanilide a polystyrene, a polyferrocenylsilane, a methine, an azomethine, a triazine, a para-aminobenzoic acid, a cinnamic acid, a urocanic acid, or a combination thereof The first light absorbing dye may include, for example, a 2-(2-hydroxyphenyl)-benzotriazole derivative alone, or a combination of two or more thereof The layer including the first light absorbing dye among the plurality of functional layers 120 may include a light scattering agent that scatters light having a wavelength of greater than about 380 nm and equal to or less than about 450 nm. The light scattering agent may be, for example, $TiO_2$ or $ZnO_2$.

As described above, the first light absorbing dye may be used alone, or in combination of two or more thereof An effect of absorbing light having a wavelength of greater than about 380 nm and equal to or less than about 450 nm may be achieved by using the single first light absorbing dye, or the effect of absorbing the light having a wavelength of greater than about 380 nm and equal to or less than about 450 nm may be achieved by combination of two or more of the first light absorbing dyes The first light absorbing dye may absorb light having a wavelength range of about 400 nm to about 450 nm.

The first light absorbing dye may be a dye having a maximum absorption wavelength of about 380 to about 410 nm. The first light absorbing dye may absorb light having a wavelength range of about 400 nm to about 410 nm.

As described above, the plurality of functional layers 120 may include the first adhesive layer. The first adhesive layer may include the first light absorbing dye. In other embodiments, the first light absorbing dye may be included in other functional layers in addition to the first adhesive layer, and/or the first adhesive layer may not include the first light absorbing dye.

The first adhesive layer may be in contact with one surface of the polarizer 110, or may be spaced apart from the polarizer 110. The polarization member 100 may further include one or more sub-adhesive layers in addition to the first adhesive layer. In an example embodiment, at least one of the sub-adhesive layers may include the first light absorbing dye.

An adhesive included in the first adhesive layer may a suitable adhesive, for example, the first adhesive layer may include a urethane-based adhesive, a fluorine-based adhesive, an epoxy-based adhesive, a polyester-based adhesive, a polyamide-based adhesive, an acryl-based adhesive, a silicon-based adhesive, or a combination thereof, etc. For example, the first adhesive layer may be the acryl-based adhesive or silicon-based adhesive.

The adhesive included in the first adhesive layer may have a suitable form, for example, an active energy ray-curing adhesive, a solvent-type (solution-type) adhesive, a hot melt-type adhesive, or an emulsion-type adhesive. For example, the first adhesive layer may include an adhesive such as an optically clear adhesive (OCA), or may include an adhesive such as an optically clear resin (OCR).

The first adhesive layer may have a form such as an adhesive sheet or an adhesive film, etc. The first adhesive layer may have a thickness of, for example, about 10 μm to about 30 μm. In a case in which the thickness of the first adhesive layer is less than about 10 μm, an adhesive effect may be relatively lower, and, in a case in which the thickness of the first adhesive layer is greater than about 30 μm, the entire thickness of the adhesive member may be relatively increased.

A weight percent (%) of the first light absorbing dye in the first adhesive layer may be appropriately adjusted depending on the thickness of the first adhesive layer. In general, the larger the thickness of the first adhesive layer is, the smaller the weight % of the first light absorbing dye is. The weight % of the first light absorbing dye in the first adhesive layer may be, for example, in a range of about 5 wt % to about 30 wt %. In a case in which the weight % of the first light absorbing dye is less than about 5 wt %, a light absorption effect may be lowered, and, in a case in which the weight % of the first light absorbing dye is greater than about 30 wt %, adhesion of the first adhesive layer may be reduced, or appearance defects may occur due to coloration by the first light absorbing dye.

The first adhesive layer may further include an additive in addition to the adhesive and the first light absorbing dye, if necessary. Examples of the additive may be a cross-linking agent, a light stabilizer, a cross-linking promoter, an antioxidant, or a combination thereof, etc.

Figure 6:
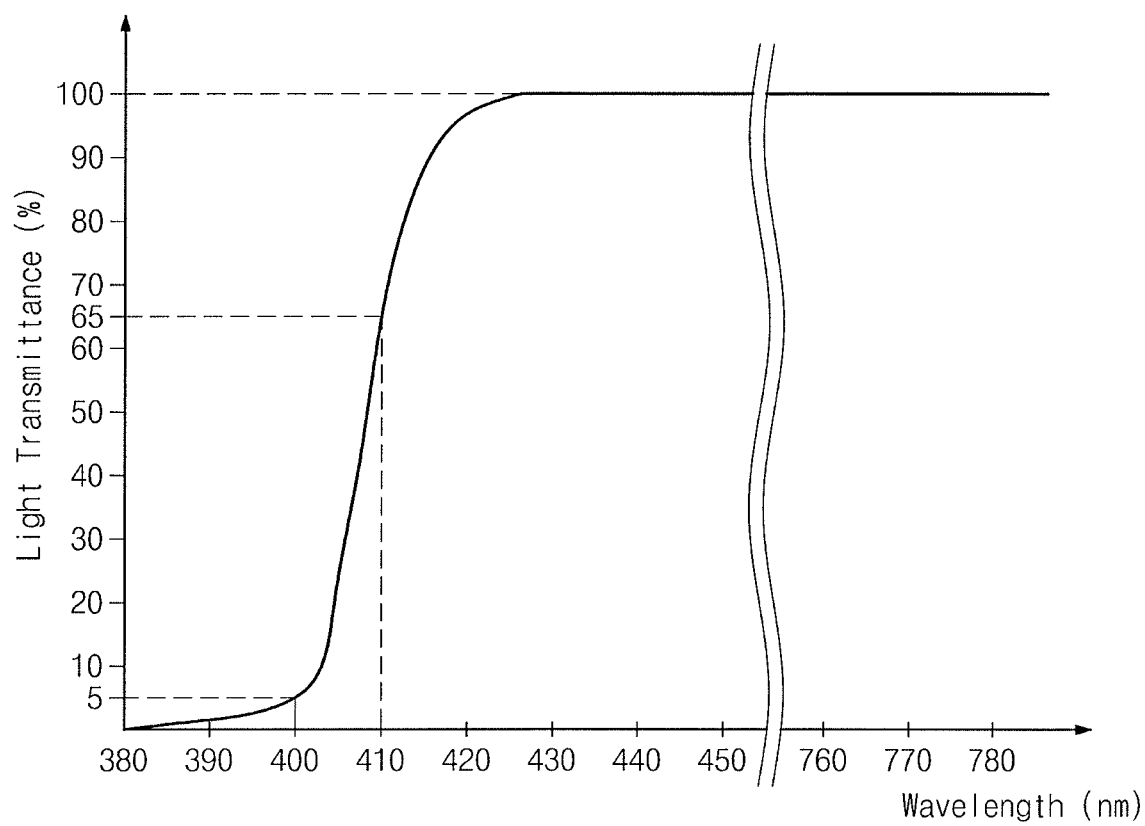
FIG. 6 is a graph illustrating light transmittance versus optical wavelength of the display device according to an example embodiment.

FIG. 6 is a graph of light transmittance versus optical wavelength of a polarization member of a display device according to an example embodiment.

Referring to FIG. 6, a light transmittance in a wavelength range of about 380 nm to about 780 nm of the functional layer including the first light absorbing dye among the plurality of functional layers 120 may be different for each wavelength. The light transmittance in a wavelength range of greater than about 380 nm and equal to or less than about 400 nm of the functional layer including the first light absorbing dye among the plurality of functional layers 120 may be about 5% or less. The light transmittance in a wavelength range of greater than about 380 nm and equal to or less than about 400 nm of the functional layer including the first light absorbing dye among the plurality of functional layers 120 may be about 0% to about 5%, and it is desirable to have a lower light transmittance in the above wavelength range. For example, the light transmittance in a wavelength range of greater than about 380 nm and equal to or less than about 400 nm of the functional layer including the first light absorbing dye among the plurality of functional layers 120 may be about 3% or less, about 2% or less, about 1% or less, or about 0.5% or less.

In the present specification, the expression "light transmittance" denotes an amount of light passing through an object when an amount of light incident on the object (e.g., the first adhesive layer) is assumed as 100%. The "light transmittance" may be measured by a typical method known in the art. For example, the "light transmittance" may be measured using Cary 100 UV-Vis by Agilent Technologies or F10-RT-UV by FILMETRICS INC.

A light transmittance in a wavelength range of about 400 nm to about 410 nm of the functional layer including the first light absorbing dye among the plurality of functional layers 120 may be about 65% or less. A light transmittance at about 405 nm may be about 65% or less and may be, for example, about 35% or less. The light transmittance in a wavelength range of about 400 nm to about 410 nm of the functional layer including the first light absorbing dye among the plurality of functional layers 120 may be about 5% to about 65%, and it is desirable to have a lower light transmittance in the above wavelength range. In a case in which the light transmittance is greater than about 65%, the functional layer may block less light having a wavelength range of about 400 nm to about 410 nm.

A light transmittance in a wavelength range of about 410 nm to about 780 nm of the functional layer including the first light absorbing dye among the plurality of functional layers 120 may be about 65% to about 100%, and it is desirable to have a higher light transmittance at about 450 nm and above. In a case in which the light transmittance in a wavelength range of greater than about 410 nm is about 65% or less, efficiency of blue light emitted from the display panel may be reduced. The reduction of the blue light efficiency may be minimized by adjusting the light transmittance in a wavelength range of greater than about 410 nm to be greater than about 65%. In the case that the light transmittance in a wavelength range of greater than about 410 nm is about 65% or less, it may be difficult for the display panel to smoothly produce various colors.

Figure 7:
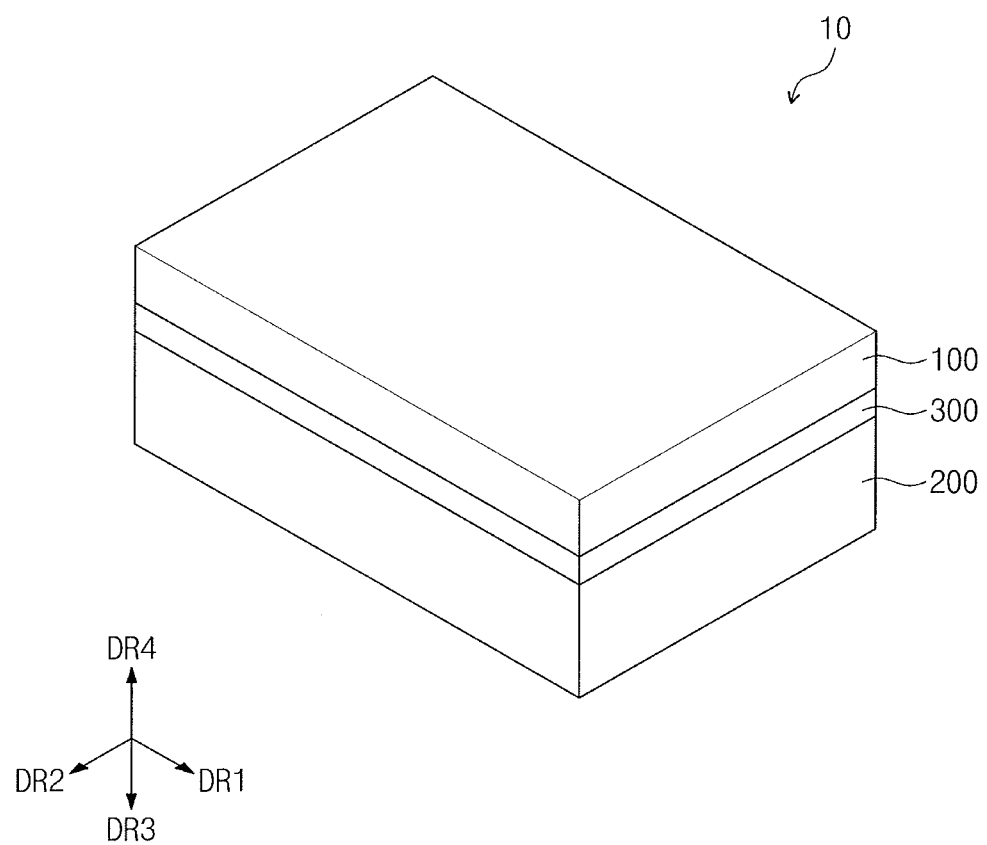
FIG. 7 is a perspective view schematically illustrating a display device according to an example embodiment.
Figure 8:
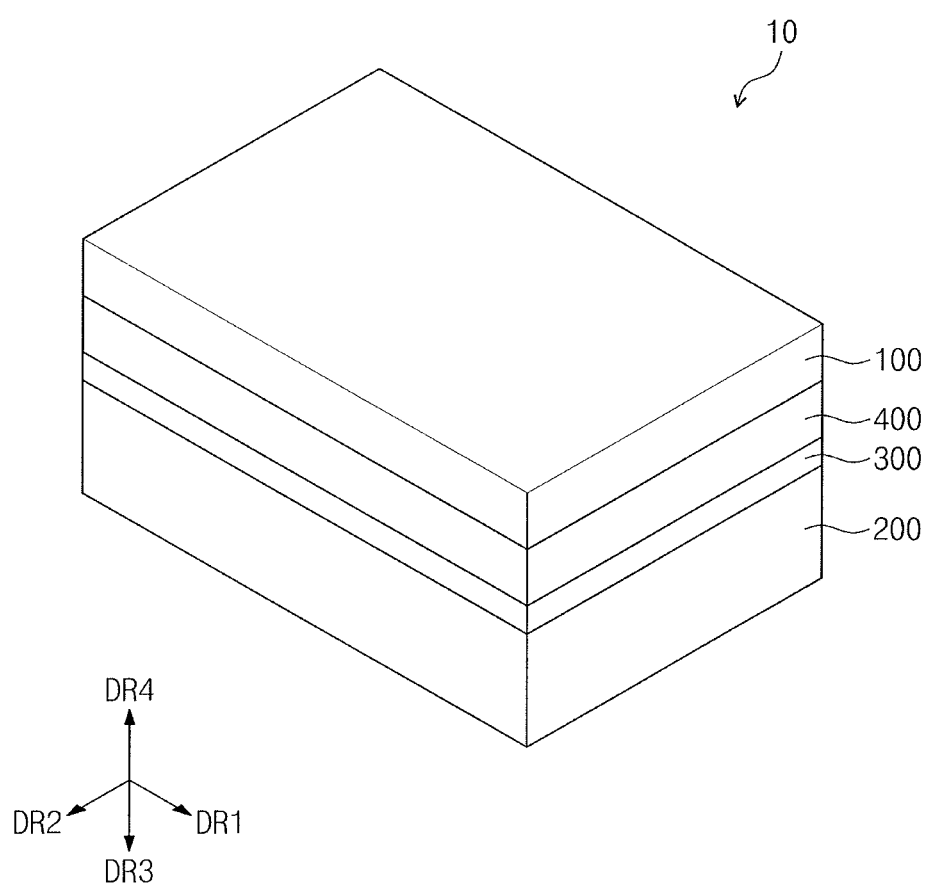
FIG. 8 is a perspective view schematically illustrating a display device according to an example embodiment.
Figure 9:
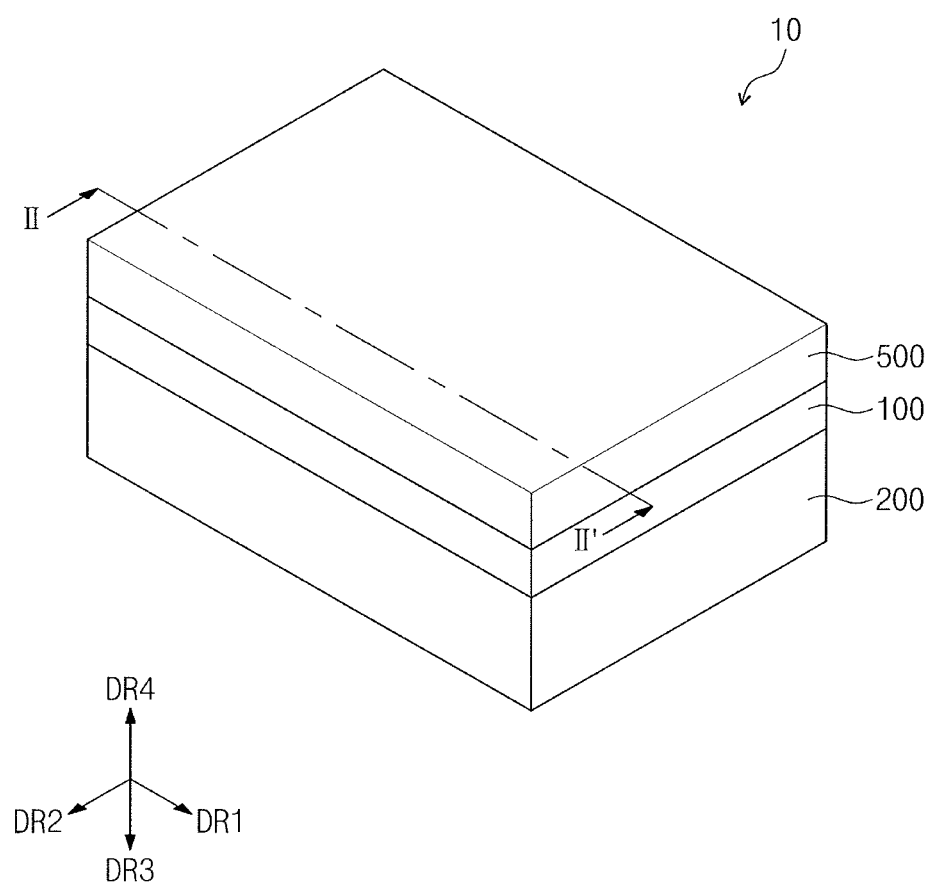
FIG. 9 is a perspective view schematically illustrating a display device according to an example embodiment.

FIG. 7 is a schematic perspective view of a display device according to an example embodiment. FIG. 8 is a perspective view schematically illustrating a display device according to an example embodiment. FIG. 9 is a perspective view schematically illustrating a display device according to an example embodiment.

Referring to FIGS. 7 to 9, a display device 10 according to an example embodiment may further include an additional component.

Referring to FIG. 7, the display device 10 according to an example embodiment may further include a second adhesive layer 300 disposed between a display panel 200 and a polarization member 100. One surface of the second adhesive layer 300 is in contact with the polarization member 100, and another surface of the second adhesive layer 300 is in contact with the display panel 200. In another implementation, a touch sensing unit may be disposed between the second adhesive layer 300 and the display panel 200. The second adhesive layer 300 may function as a double-sided adhesive layer.

Referring to FIG. 8, the display device 10 according to an example embodiment may further include a touch sensing unit 400 disposed between a display panel 200 and a polarization member 100, and a second adhesive layer 300 may be disposed between the display panel 200 and the touch sensing unit 400. In another implementation, the touch sensing unit 400 may be directly disposed on a top surface of the display panel 200.

The second adhesive layer 300 may include a second light absorbing dye that absorbs light having a wavelength of greater than about 380 nm and equal to or less than about 450 nm. In another implementation, the second adhesive layer 300 may perform an adhesive function without including the second light absorbing dye.

A suitable dye that absorbs light having a wavelength of greater than about 380 nm and equal to or less than about 450 nm may be used as the second light absorbing dye. The second light absorbing dye may be the same as the first light absorbing dye, or the second light absorbing dye may be different from the first light absorbing dye. The second light absorbing dye may include, for example, benzotriazoles, benzophenones, salicylic acids, salicylates, cyanoacrylates, cinnamates, oxanilides, polystyrenes, polyferrocenylsilanes, methines, azomethines, triazines, para-aminobenzoic acids, cinnamic acids, urocanic acids, or a combination thereof.

The second light absorbing dye may include, for example, a 2-(2-hydroxyphenyl)-benzotriazole derivative alone or a combination of two or more thereof, etc.

The second light absorbing dye may absorb light having a wavelength range of about 400 nm to about 450 nm.

The second light absorbing dye may be a dye having a maximum absorption wavelength of about 380 to about 410 nm. The second light absorbing dye may absorb light having a wavelength range of about 400 nm to about 410 nm.

An adhesive included in the second adhesive layer 300 may be or include, for example, a urethane-based adhesive, a fluorine-based adhesive, an epoxy-based adhesive, a polyester-based adhesive, a polyamide-based adhesive, an acryl-based adhesive, a silicon-based adhesive, or a combination thereof, etc. For example, the second adhesive layer 300 may be the acryl-based adhesive or silicon-based adhesive.

The adhesive included in the second adhesive layer 300 may be, for example, an active energy ray-curing adhesive, a solvent-type (solution-type) adhesive, a hot melt-type adhesive, or an emulsion-type adhesive. For example, the second adhesive layer 300 may include an adhesive such as an optically clear adhesive (OCA), or may include an adhesive such as an optically clear resin (OCR).

The second adhesive layer 300 may have a form such as an adhesive sheet or an adhesive film. The second adhesive layer 300, for example, may have a thickness of about 20 μm to about 50 μm. The thickness of the second adhesive layer 300 may be larger than the thickness of the first adhesive layer. In a case in which the thickness of the second adhesive layer 300 is less than about 20 μm, an adhesive effect may be lowered, and, in a case in which the thickness of the second adhesive layer 300 is greater than about 50 μm, the entire thickness of the adhesive member may be increased.

A weight percent (%) of the second light absorbing dye in the second adhesive layer 300 may be appropriately adjusted depending on the thickness of the second adhesive layer 300. In general. the larger the thickness of the second adhesive layer 300 is, the smaller the weight % of the second light absorbing dye is. For example, the weight % of the second light absorbing dye in the second adhesive layer 300 may be in a range of about 0.5 wt % to about 15 wt %. In a case in which the weight % of the second light absorbing dye is less than about 0.5 wt %, a light absorption effect may be lowered, and, in a case in which the weight % of the second light absorbing dye is greater than about 15 wt %, adhesion of the second adhesive layer 300 may be reduced, or appearance defects may occur due to coloration by the second light absorbing dye.

The second adhesive layer 300 may further include an additive in addition to the adhesive and the second light absorbing dye. Descriptions of the additive are the same as those described in connection with the first adhesive layer.

A light transmittance in a wavelength range of about 380 nm to about 780 nm of the second adhesive layer 300 may be different for each wavelength. A light transmittance in a wavelength range of greater than about 380 nm and equal to or less than about 400 nm of the second adhesive layer 300 may be about 5% or less. The light transmittance in a wavelength range of greater than about 380 nm and equal to or less than about 400 nm of the second adhesive layer 300 may be about 0% to about 5%, and it is desirable to have a lower light transmittance in the above wavelength range. For example, the light transmittance in a wavelength range of greater than about 380 nm and equal to or less than about 400 nm of the second adhesive layer 300 may be about 3% or less, about 2% or less, about 1% or less, or about 0.5% or less.

A light transmittance in a wavelength range of about 400 nm to about 410 nm of the second adhesive layer 300 may be about 65%. A light transmittance at about 405 nm may be about 65% or less and may be, for example, about 35% or less. The light transmittance in a wavelength range of about 400 nm to about 410 nm of the second adhesive layer 300 may be about 5% to about 65%. and it is desirable to have a lower light transmittance in the above wavelength range. In a case in which the light transmittance is greater than about 65%, the second adhesive layer 300 may block less light having a wavelength range of about 400 nm to about 410 nm.

A light transmittance in a wavelength range of about 410 nm to about 780 nm of the second adhesive layer 300 may be about 65% to about 100%, and it is desirable to have a higher light transmittance in the above wavelength range. In a case in which the light transmittance in a wavelength range of greater than about 410 nm is about 65% or less, efficiency of blue light emitted from the display panel may be reduced.

Referring to FIG. 9, the display device 10 according to an example embodiment may further include a window member 500 disposed on the polarization member 100. The window member 500 may protect the polarization member 100 and the display panel 200 from an external impact. Although not shown in FIG. 7, a black matrix may be disposed on a surface of the window member 500 facing the polarization member 100.

Figure 10:
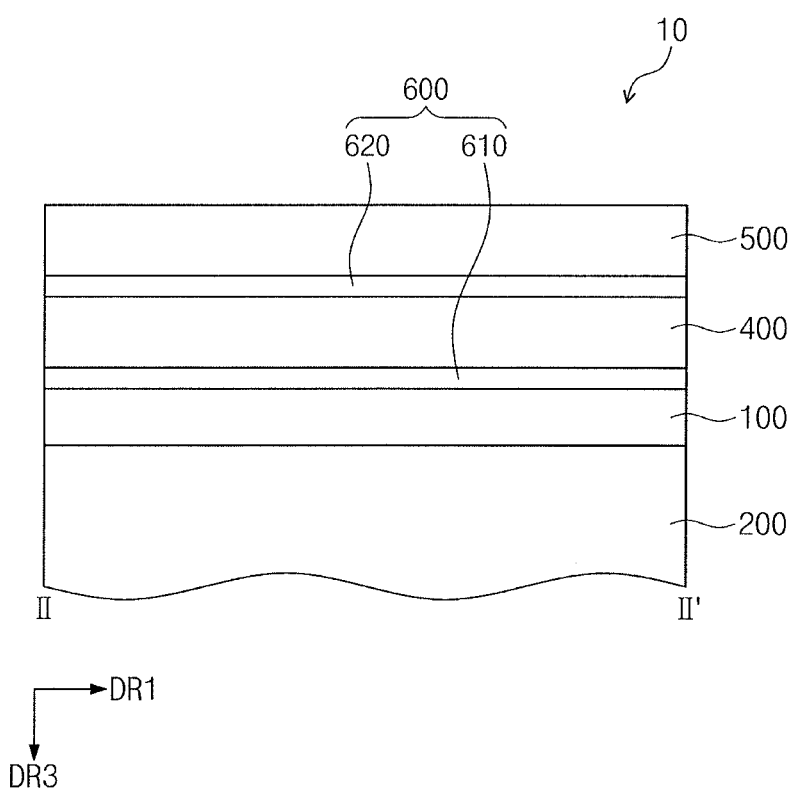
FIG. 10 is a schematic cross-sectional view taken along line II-II' of FIG. 9.
Figure 11:
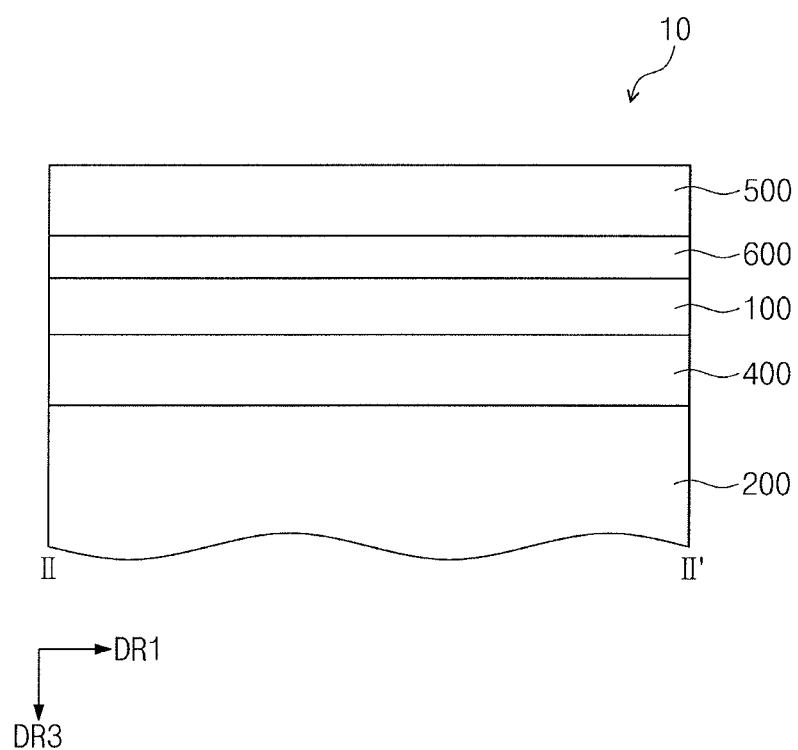
FIG. 11 is a schematic cross-sectional view taken along line II-II' of FIG. 9.
Figure 12:
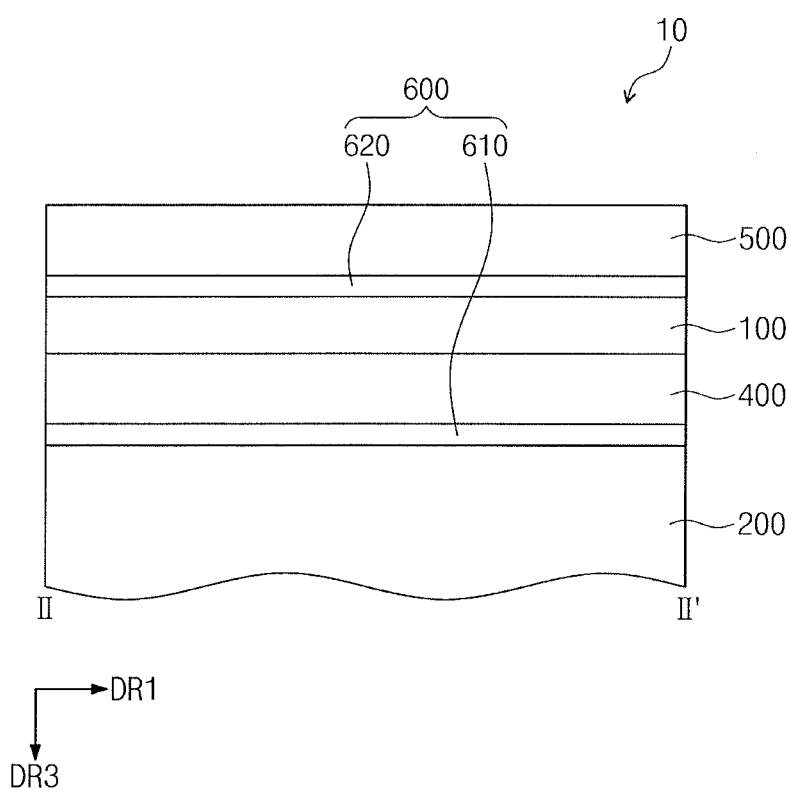
FIG. 12 is a schematic cross-sectional view taken along line II-II' of FIG. 9.

FIG. 10 is a schematic cross-sectional view taken along line II-II' of FIG. 9. FIG. 11 is a schematic cross-sectional view taken along line II-II' of FIG. 9. FIG. 12 is a schematic cross-sectional view taken along line II-II' of FIG. 9.

Referring to FIGS. 10 and 11, the display device 10 according to an example embodiment may further include a third adhesive layer 600 disposed between the polarization member 100 and the window member 500. One surface of the third adhesive layer 600 may be in contact with the polarization member 100, and another surface of the third adhesive layer 600 may be in contact with the window member 500. In another implementation, a touch sensing unit may be disposed between the polarization member 100 and the third adhesive layer 600 or the third adhesive layer 600 and the window member 500. The third adhesive layer 600 may function as a double-sided adhesive layer.

Referring to FIG. 10, a touch sensing unit 400 may be disposed between the polarization member 100 and the window member 500, and the third adhesive layer 600 may include a first sub-adhesive layer 610 disposed between the polarization member 100 and the touch sensing unit 400 and a second sub-adhesive layer 620 disposed between the touch sensing unit 400 and the window member 500. However, the embodiment of the inventive concept is not limited thereto, and, referring to FIG. 11, the touch sensing unit 400 may be disposed between the polarization member 100 and the display panel 200. The touch sensing unit 400 may be disposed on the display panel 200 by the medium of the adhesive layer and may be directly disposed on the display panel 200.

The embodiment of the inventive concept may be variously changed, and, referring to FIG. 12, the third adhesive layer 600 may include the sub-adhesive layer 620 disposed between the polarization member 100 and the window member 500.

The third adhesive layer 600 may include a third light absorbing dye that absorbs light having a wavelength of greater than about 380 nm and equal to or less than about 450 nm. In a case in which the third adhesive layer 600 includes the first sub-adhesive layer 610 and the second sub-adhesive layer 620, at least one of the first sub-adhesive layer 610 or the second sub-adhesive layer 620 may include the third light absorbing dye. In another implementation, the third adhesive layer 600 may perform an adhesive function without including the third light absorbing dye.

A suitable dye that absorbs light having a wavelength of greater than about 380 nm and equal to or less than about 450 nm may be used as the third light absorbing dye. The third light absorbing dye may be the same as the first light absorbing dye, or the third light absorbing dye may be different from the first light absorbing dye. The third light absorbing dye may include, for example, benzotriazoles, benzophenones, salicylic acids, salicylates, cyanoacrylates, cinnamates, oxanilides. polystyrenes, polyferrocenylsilanes, methines, azomethines, triazines, para-aminobenzoic acids, cinnamic acids, urocanic acids, or a combination thereof.

The third light absorbing dye may include, for example a 2-(2-hydroxyphenyl)-benzotriazole derivative alone or a combination of two or more thereof, etc.

The third light absorbing dye may absorb light having a wavelength range of about 400 nm to about 450 nm.

The third light absorbing dye may be a dye having a maximum absorption wavelength of about 380 to about 410 nm. The third light absorbing dye may absorb light having a wavelength range of about 400 nm to about 410 nm.

The third adhesive layer 600 may include, for example, a urethane-based adhesive, a fluorine-based adhesive, an epoxy-based adhesive, a polyester-based adhesive, a polyamide-based adhesive, an acryl-based adhesive, a silicon-based adhesive, or a combination thereof, etc. For example, the third adhesive layer 600 may be the acryl-based adhesive or silicon-based adhesive.

The adhesive included in the third adhesive layer 600 may be, for example, an active energy ray-curing adhesive, a solvent-type (solution-type) adhesive, a hot melt-type adhesive, or an emulsion-type adhesive. For example, the third adhesive layer 600 may include an adhesive such as an optically clear adhesive (OCA), or may include an adhesive such as an optically clear resin (OCR).

The third adhesive layer 600 may have a form such as an adhesive sheet or an adhesive film, etc. The third adhesive layer 600, for example, may have a thickness of about 70 μm to about 200 μm. The thickness of the third adhesive layer 600 may be larger than the thickness of the first adhesive layer. The thickness of the third adhesive layer 600 may be larger than the thickness of the second adhesive layer 300. In a case in which the thickness of the third adhesive layer 600 is less than about 70 μm, an adhesive effect may be lowered and delamination may occur, and, in a case in which the thickness of the third adhesive layer 600 is greater than about 200 μm, it may become thick.

A weight percent (%) of the third light absorbing dye in the third adhesive layer 600 may be appropriately adjusted depending on the thickness of the third adhesive layer 600. In general, the larger the thickness of the third adhesive layer 600 is, the smaller the weight % of the third light absorbing dye is. For example, the weight % of the third light absorbing dye in the third adhesive layer 600 may be in a range of about 0.1 wt % to about 10 wt %. In a case in which the weight % of the third light absorbing dye is less than about 0.1 wt %, a light absorption effect may be lowered, and, in a case in which the weight % of the third light absorbing dye is greater than about 10 wt %, adhesion of the third adhesive layer 600 may be reduced, or appearance defects may occur due to coloration by the third light absorbing dye.

The third adhesive layer 600 may further include an additive in addition to the adhesive and the third light absorbing dye. Descriptions of the additive are the same as those described in the first adhesive layer.

A light transmittance in a wavelength range of about 380 nm to about 780 nm of the third adhesive layer 600 may be different for each wavelength. A light transmittance in a wavelength range of greater than about 380 nm and equal to or less than about 400 nm of the third adhesive layer 600 may be about 5% or less. The light transmittance in a wavelength range of greater than about 380 nm and equal to or less than about 400 nm of the third adhesive layer 600 may be about 0% to about 5%, and it is desirable to have a lower light transmittance in the above wavelength range. For example, the light transmittance in a wavelength range of greater than about 380 nm and equal to or less than about 400 nm of the third adhesive layer 600 may be about 3% or less, about 2% or less, about 1% or less, or about 0.5% or less.

A light transmittance in a wavelength range of about 400 nm to about 410 nm of the third adhesive layer 600 may be about 65% or less. A light transmittance at about 405 nm may be about 65% or less and may be, for example, about 35% or less. The light transmittance in a wavelength range of about 400 nm to about 410 nm of the third adhesive layer 600 may be about 5% to about 65%, and it is desirable to have a lower light transmittance in the above wavelength range. In a case in which the light transmittance is greater than about 65%, the third adhesive layer 600 may block less light having a wavelength range of about 400 nm to about 410 nm.

A light transmittance in a wavelength range of about 410 nm to about 780 nm of the third adhesive layer 600 may be about 65% to about 100%, and it is desirable to have a higher light transmittance in the above wavelength range. In a case in which the light transmittance in a wavelength range of greater than about 410 nm is about 65% or less, efficiency of blue light emitted from the display panel may be reduced.

Referring to FIG. 1, the display panel 200 is disposed under the polarization member 100. Hereinafter, it will be described as an example that the display panel 200 is an organic electroluminescent display panel, but the display panel 200 may be, for example, a liquid crystal display panel, a plasma display panel, an electrophoretic display panel, a microelectromechanical system (MEMS) display panel, or an electrowetting display panel, etc.

Figure 13:
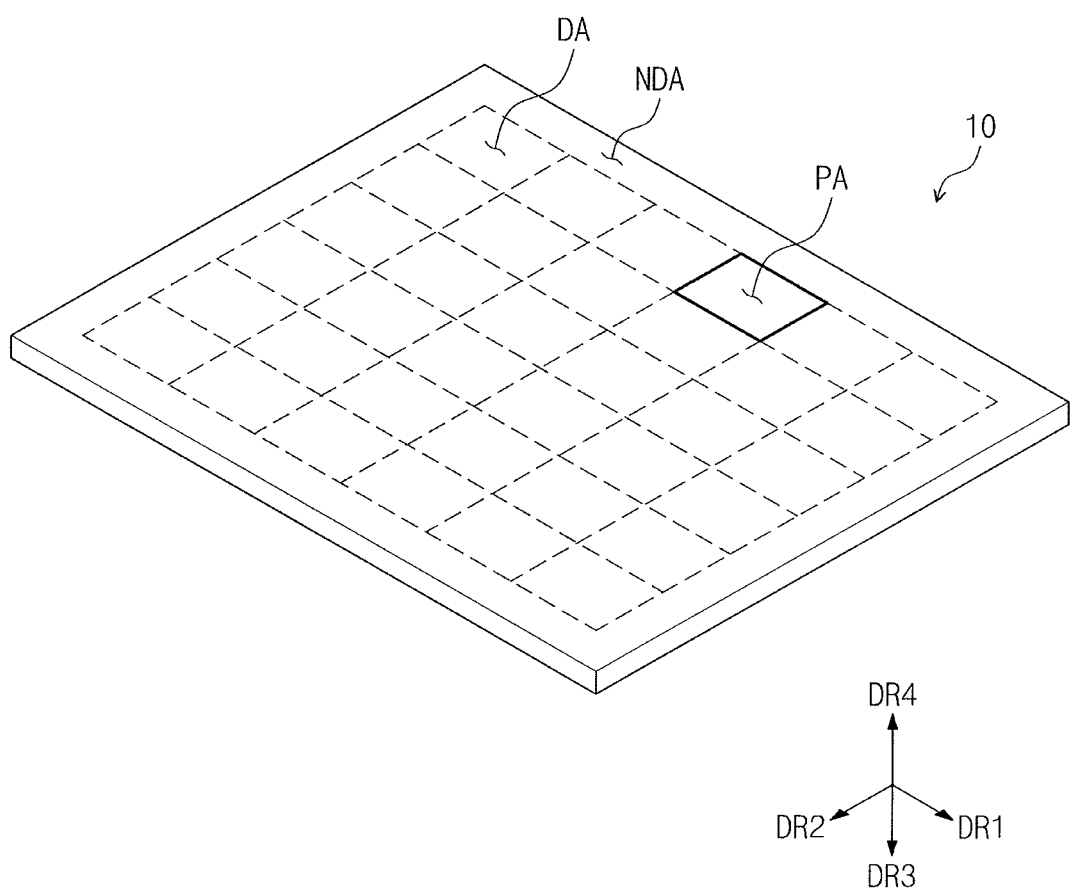
FIG. 13 is a perspective view schematically illustrating the display device according to an example embodiment.

FIG. 13 is a schematic perspective view of a display device according to an example embodiment.

Referring to FIG. 13, the display device 10 according to an example embodiment includes a display area DA and a non-display area NDA. The display area DA displays an image. When viewed from a thickness direction of the display device 10, the display area DA may have, for example, an approximately rectangular shape.

The display area DA includes a plurality of pixel areas PA. The pixel areas PA may be arranged in the form of a matrix. The pixel areas PA may be defined by a pixel-defining layer (see PDL of FIG. 16). The pixel areas PA may include each of a plurality of pixels (see PX of FIG. 14).

The non-display area NDA does not display an image. When viewed from the thickness direction DR3 of the display device 10, the non-display area NDA, for example, may surround the display area DA. The non-display area NDA may be adjacent to the display area DA in a first direction DR1 and a second direction DR2 crossing the first direction DR1.

Figure 14:
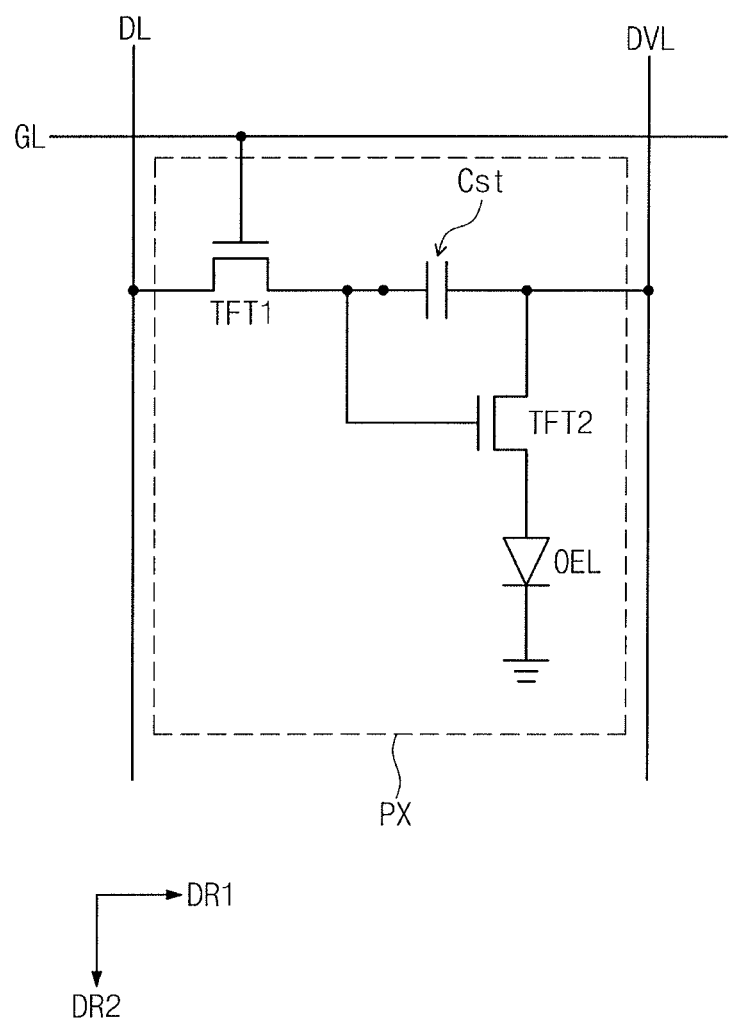
FIG. 14 is a circuit diagram of one of pixels included in the display device according to an example embodiment.
Figure 15:
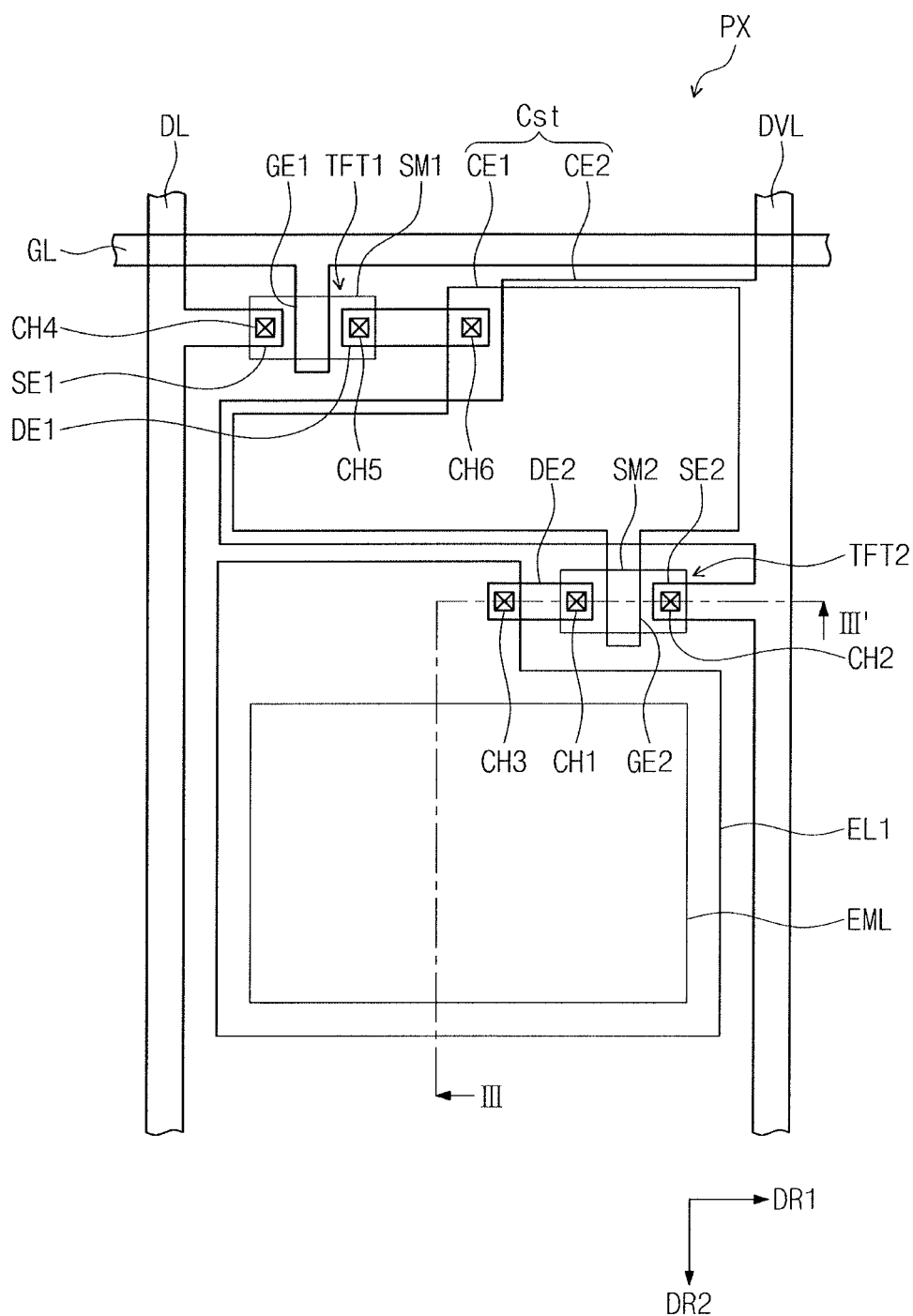
FIG. 15 is a plan view of one of the pixels included in the display device according to an example embodiment.
Figure 16:
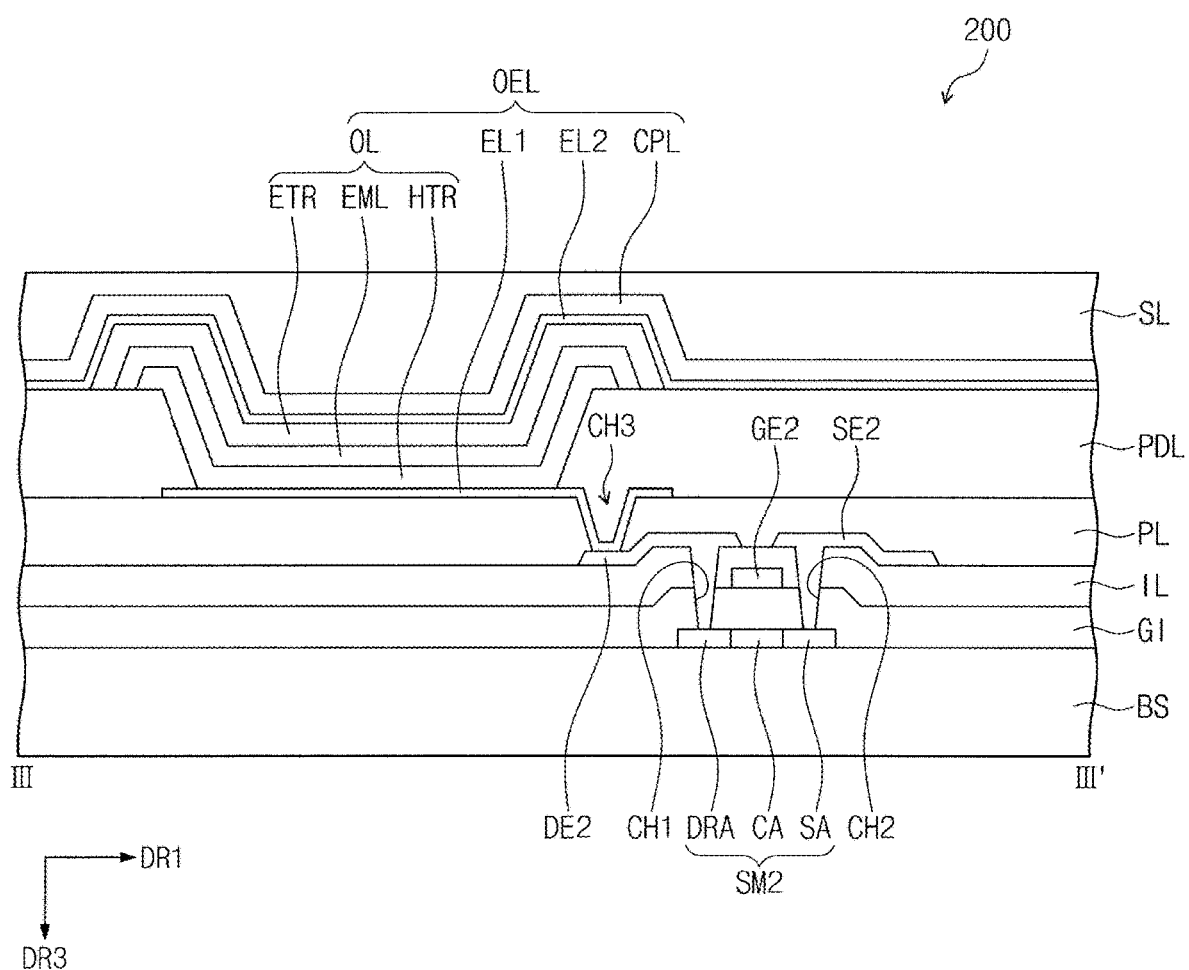
FIG. 16 is a schematic cross-sectional view taken along line of FIG. 14.

FIG. 14 is a circuit diagram of a pixel included in the display device according to an example embodiment. FIG. 15 is a plan view of a pixel included in the display device according to an example embodiment. FIG. 16 is a schematic cross-sectional view taken along line of FIG. 15.

Referring to FIGS. 14 and 15, each of the pixels PX may be connected to a wiring unit having gate lines GL, data lines DL, and driving voltage lines DVL. Each of the pixels PX may include thin film transistors TFT1 and TFT2 connected to the wiring unit, an organic electroluminescent device OEL connected to the thin film transistors TFT1 and TFT2, and a capacitor Cst.

In the present example embodiment, it has been illustrated as an example that a single pixel is connected to a single gate line, a single data line, and a single driving voltage line, but the plurality of pixels PX may be connected to a single gate line, a single data line, and a single driving voltage line, and/or a single pixel may be connected to at least one gate line, at least one data line, and at least one driving voltage line, etc.

The gate lines GL extend in the first direction DR1. The data lines DL extend in the second direction DR2 crossing the gate lines GL. The driving voltage lines DVL extend in substantially the same direction as the data lines DL, i.e., the second direction DR2. The gate lines GL transmit a scanning signal to the thin film transistors TFT1 and TFT2, the data lines DL transmit a data signal to the thin film transistors TFTI and TFT2, and the driving voltage lines DVL provide a driving voltage to the thin film transistors TFTI and TFT2.

Each of the pixels PX may emit light of a particular color, for example, one of red light, green light, and blue light, or light such as cyan light, magenta light, and yellow light may be added. Each of the pixels PX may emit white light.

The thin film transistors TFTI and TFT2 may include the driving thin film transistor TFT2 for controlling the organic electroluminescent device OEL and the switching thin film transistor TFTI configured to switch the driving thin film transistor TFT2. In the present example embodiment, although it has been described that each of the pixels PX includes the two thin film transistors TFT1 and TFT2, each of the pixels PX may include, for example, a single thin film transistor and a capacitor, or each of the pixels PX may include three or more thin film transistors and two or more capacitors, etc.

The switching thin film transistor TFT1 includes a first gate electrode GE1, a first source electrode SE1, and a first drain electrode DEL The first gate electrode GE1 is connected to the gate lines GL and the first source electrode SEI is connected to the data lines DL. The first drain electrode DE1 is connected to a first common electrode CE1 through a fifth contact hole CH5. The switching thin film transistor TFT1 transmits the data signal, which is applied to the data lines DL, to the driving thin film transistor TFT2 according to the scanning signal applied to the gate lines GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage lines DVL. The second drain electrode DE2 is connected to a first electrode EL1 through a third contact hole CH3.

The first electrode EL1 is connected to the second drain electrode DE2 of the driving thin film transistor TFT2. A common voltage is applied to a second electrode EL2, and an emission layer EML displays an image by emitting light according to an output signal of the driving thin film transistor TFT2.

The capacitor Cst is connected between the second gate electrode GE2 and the second source electrode SE2 of the driving thin film transistor TFT2, and charges and maintains the data signal input from the second gate electrode GE2 of the driving thin film transistor TFT2. The capacitor Cst may include the first common electrode CEI, which is connected to the first drain electrode DEI through a sixth contact hole CH6, and a second common electrode CE2 which is connected to the driving voltage lines DVL.

Referring to FIGS. 14 to 16, a base substrate BS may include, for example, plastic and an organic polymer. The organic polymer constituting the base substrate BS may include, for example, polyethylene terephthalate (PET), polyethylene naphthalate (PEN), polyimide, or polyethersulfone. The base substrate BS may be, for example, a glass substrate. The base substrate BS may be selected in consideration of mechanical strength, thermal stability, transparency, surface smoothness, ease of handling, or waterproofing properties. The base substrate BS may be transparent.

A substrate buffer layer may be disposed on the base substrate BS. The substrate buffer layer may help prevent the diffusion of impurities into the switching thin film transistor TFT1 and the driving thin film transistor TFT2. The substrate buffer layer may be formed of, for example, silicon nitride ($SiN_x$), silicon oxide ($SiO_x$), or silicon oxynitride ($SiO_xN_y$), etc., or may be omitted depending on the material of the base substrate BS and process conditions.

A first semiconductor pattern SM1 and a second semiconductor pattern SM2 are disposed on the base substrate BS. The first semiconductor pattern SMI and the second semiconductor pattern SM2 are formed of a semiconductor material and respectively operate as active layers of the switching thin film transistor TFT1 and the driving thin film transistor TFT2. Each of the first semiconductor pattern SM1 and the second semiconductor pattern SM2 includes a source portion SA, a drain portion DRA, and a channel region CA disposed between the source portion SA and the drain portion DRA. Each of the first semiconductor pattern SMI and the second semiconductor pattern SM2 may be formed by being selected from an inorganic semiconductor or an organic semiconductor. The source portion SA and the drain portion DA may be doped with an n-type impurity or a p-type impurity.

A gate insulating layer GI is disposed on the first semiconductor pattern SM1 and the second semiconductor pattern SM2. The gate insulating layer GI covers the first semiconductor pattern SM1 and the second semiconductor pattern SM2. The gate insulating layer GI may be formed of an organic insulating material or an inorganic insulating material.

The first gate electrode GE1 and the second gate electrode GE2 are disposed on the gate insulating layer GI. The first gate electrode GE1 and the second gate electrode GE2 are respectively formed to cover regions corresponding to the channel regions CA of the first semiconductor pattern SM1 and the second semiconductor pattern SM2.

An insulating layer IL is disposed on the first gate electrode GE1 and the second gate electrode GE2. The insulating layer IL covers the first gate electrode GE1 and the second gate electrode GE2. The insulating layer IL may be formed of an organic insulating material or an inorganic insulating material.

The first source electrode SE1, the first drain electrode DE1, the second source electrode SE2, and the second drain electrode DE2 are disposed on the insulating layer IL. The second drain electrode DE2 is in contact with the drain portion DRA of the second semiconductor pattern SM2 through a first contact hole CH1 formed in the gate insulating layer GI and the insulating layer IL, and the second source electrode SE2 is in contact with the source portion SA of the second semiconductor pattern SM2 through a second contact hole CH2 formed in the gate insulating layer GI and the insulating layer IL. The first source electrode SE1 is in contact with a source portion of the first semiconductor pattern SMI through a fourth contact hole CH4 formed in the gate insulating layer GI and the insulating layer IL, and the first drain electrode DEI is in contact with a drain portion of the first semiconductor pattern SM1 through the fifth contact hole CH5 formed in the gate insulating layer GI and the insulating layer IL.

A passivation layer PL is disposed on the first source electrode SE1, the first drain electrode DE1, the second source electrode SE2, and the second drain electrode DE2. The passivation layer PL may function as a protective layer configured to protect the switching thin film transistor TFT1 and the driving thin film transistor TFT2 or may function as a planarization layer configured to planarize top surfaces thereof.

The first electrode EL1 is disposed on the passivation layer PL. The first electrode EL1 may be, for example, a cathode. The first electrode EL1 is connected to the second drain electrode DE2 of the driving thin film transistor TFT2 through the third contact hole CH3 formed in the passivation layer PL.

The pixel-defining layer PDL partitioning the emission layer EML to correspond to each of the pixels PX is disposed on the passivation layer PL. The pixel-defining layer PDL exposes a top surface of the first electrode EL1 and protrudes from the base substrate BS. The pixel-defining layer PDL may include a metal fluoride, but the pixel-defining layer PDL is not limited thereto. For example, the pixel-defining layer PDL may be formed of any one metal fluoride of LiF, $BaF_2$, and CsF. The metal fluoride has insulating properties when it has a predetermined thickness. A thickness of the pixel-defining layer PDL may be, for example, in a range of about 10 nm to about 100 nm.

The organic electroluminescent device OEL is disposed in an area surrounded by the pixel-defining layer PDL. The organic electroluminescent device OEL includes the first electrode ELL an organic layer OL, and the second electrode EL2. The organic layer OL includes the emission layer EML. The organic layer OL may include a hole transport region HTR, the emission layer EML, and an electron transport region ETR. The organic electroluminescent device OEL may further include a capping layer CPL disposed on the second electrode EL2. The first electrode EL1 has conductivity. The first electrode EL1 may be a pixel electrode or a cathode. The first electrode EL1 may be a transmissive electrode, a transflective electrode, or a reflective electrode. In a case in which the first electrode EL1 is a transmissive electrode, the first electrode EL1 may be formed of a transparent metal oxide, for example, indium tin oxide (ITO), indium zinc oxide (IZO), zinc oxide (ZnO), and indium tin zinc oxide (ITZO). In a case in which the first electrode ELI is a transflective electrode or a reflective electrode, the first electrode EL1 may include at least one of aluminum (Al). copper (Cu), titanium (Ti), molybdenum (Mo), silver (Ag), magnesium (Mg), platinum (Pt), palladium (Pd), gold (Au), nickel (Ni), neodymium (Nd), iridium (Ir), and chromium (Cr).

The organic layer OL may be disposed on the first electrode ELI. The organic layer OL includes the emission layer EML. The organic layer OL may further include the hole transport region HTR and the electron transport region ETR.

The hole transport region HTR is disposed on the first electrode ELI. The hole transport region HTR may include at least one of a hole injection layer, a hole transport layer, a buffer layer, or an electron blocking layer.

The hole transport region HTR may be a single layer formed of a single material, may be a single layer formed of a plurality of different materials, or may have a multilayered structure having a plurality of layers formed of a plurality of different materials.

For example, the hole transport region HTR may have a structure of single layers formed of a plurality of different materials or may have a structure of hole injection layer/hole transport layer, hole injection layer/hole transport layer/ buffer layer, hole injection layer/buffer layer, hole transport layer/buffer layer, or hole injection layer/hole transport layer/electron blocking layer which are sequentially stacked from the first electrode ELI, etc.

The hole transport region HTR may be formed by using various methods such as a vacuum deposition method, a spin coating method, a casting method, a Langmuir-Blodgett (LB) method, an inkjet printing method, a laser printing method, and a laser induced thermal imaging (LITI) method.

In a case in which the hole transport region HTR includes the hole injection layer, the hole transport region HTR may include a phthalocyanine compound such as copper phthalocyanine; N,N'-diphenyl-N,N-bis-[4-(phenyl-m-tolylamino)-phenyl]-biphenyl-4,4'-diamine (DNTPD), 4,4',4"-tris(3-methylphenyl phenylamino)triphenylamine (m-MTDATA), 4,4',4"-tris(N,N-diphenylamino)triphenylamine (TDATA), 4.4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS), but an example embodiment is not limited thereto.

In a case in which the hole transport region HTR includes the hole transport layer, the hole transport region HTR may include a carbazole-based derivative, such as N-phenyl carbazole and polyvinyl carbazole, a fluorine-based derivative, a triphenylamine-based derivative, such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(1-naphthyl)-N,N-diphenylbenzidine (NPB), or 4,4'-cyclohexylidene bis[N,N-bis(4-methylphenyl)benzenamine] (TAPC), etc.

In addition to the above-described materials, the hole transport region HTR may further include a charge generating material for improving conductivity. The charge generating material may be uniformly or non-uniformly dispersed in the hole transport region HTR. The charge generating material may be, for example, a p-type dopant. The p-type dopant may be one of a quinone derivative, a metal oxide, or a cyano group-containing compound, etc. For example, examples of the p-type dopant may include a quinone derivative, such as tetracyanoquinodimethane (TCNQ) or 2,3,5,6-tetrafluoro-tetracyanoquinodimethane (F4-TCNQ), and a metal oxide such as tungsten oxide or molybdenum oxide.

The emission layer EML is disposed on the hole transport region HTR. The emission layer EML may be a single layer formed of a single material, may be a single layer formed of a plurality of different materials or may have a multilayered structure having a plurality of layers formed of a plurality of different materials.

The emission layer EML, may be formed of. for example, a material that emits red light, green light, or blue light. and may include a fluorescent material or a phosphorescent material. Also. the emission layer EML may include a host and a dopant.

A material of the host may be, for example, tris(8-hydroxyquinolino)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris (carbazol-9-yl)-triphenylamine (TCTA), 1,3,5-tris(N-phenylbenzimidazole-2-yl)benzene (TPBi), 3-tert-butyl-9,10-di (naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN), etc.

In a case in which the emission layer EML emits red light, the emission layer EML may include, for example, a fluorescent material including tris(dibenzoylmethanato) phenanthoroline europium (PBD:Eu(DBM)3(Phen)) or perylene. In the case that the emission layer EML emits red light, the dopant included in the emission layer EML may be, for example, a metal complex or organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP).

In a case in which the emission layer EML emits green light, the emission layer EML may include, for example, a fluorescent material including tris(8-hydroxyquinolino)aluminum (Alq3). In the case that the emission layer EML emits green light, the dopant included in the emission layer EML may be, for example, selected from a metal complex or organometallic complex such as fac-tris(2-phenylpyridine)iridium (Ir(ppy)$_3$).

In a case in which the emission layer EML emits blue light, the emission layer EML may include, for example, a fluorescent material which includes one selected from the group consisting of spiro-DPVBi, spiro-6P, distyryl-benzene (DSB), distyrylarylene (DSA), a polyfluorene (PFO)-based polymer, a poly(p-phenylene vinylene) (PPV)-based polymer, or a combination thereof. In the case that the emission layer EML emits blue light, the dopant included in the emission layer EML may be, for example, selected from a metal complex or organometallic complex such as (4,6-F2ppy)$_2$Irpic. The emission layer EML will be described in more detail later.

The electron transport region ETR is disposed on the emission layer EML. The electron transport region ETR may include at least one of a hole blocking layer, an electron transport layer, and an electron injection layer, etc.

In a case in which the electron transport region ETR includes the electron transport layer, the electron transport region ETR may include tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-l-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato)aluminum (BAlq), berylliumbis(benzoquinolin-10-olate) (Bebq2), 9,10-di(naphthalene-2-yl)anthracene (ADN), and a mixture thereof, etc. A thickness of the electron transport layer may be in a range of about 100 Å to about 1,000 Å, for example, about 150 Å to about 500 Å. In a case in which the thickness of the electron transport layer satisfies the above-described range, desirable electron transport characteristics may be obtained without a substantial increase in driving voltage.

In the case that the electron transport region ETR includes the electron injection layer, LiF, lithium quinolate (LiQ), Li$_2$O, BaO, NaCl, CsF, a lanthanide metal, such as ytterbium (Yb), or a metal halide. such as RbCl and RbI, may be used in the electron transport region ETR, etc. The electron injection layer may also be formed of a material in which an electron transport material and an insulating organometallic salt are mixed. The organometallic salt may be a material having an energy band gap of about 4 eV or more. Specific examples of the organometallic salt may be metal acetate, metal benzoate, metal acetoacetate, metal acetylacetonate. or metal stearate. A thickness of the electron injection layer may be in a range of about 1 Å to about 100 Å, for example, about 3 Å to about 90 Å. In a case in which the thickness of the electron injection layer satisfies the above-described range, satisfactory electron injection characteristics may be obtained without a substantial increase in driving voltage.

As described above, the electron transport region may include the hole blocking layer. The hole blocking layer may include, for example, at least one of 2,9-dimethyl-4,7-diphenyl-1,10-phenanthroline (BCP) and 4,7-diphenyl-1,10-phenanthroline (Bphen), etc.

The second electrode EL2 is disposed on the electron transport region ETR. The second electrode EL2 may be a common electrode or an anode.

The second electrode EL2 may be a transmissive electrode, a transflective electrode, or a reflective electrode. In a case in which the second electrode EL2 is a transmissive electrode, the second electrode EL2 may include lithium (Li), calcium (Ca), LiF/Ca, LiF/Al, Al, Mg, BaF, barium (Ba), Ag, or a compound or mixture thereof (e.g., mixture of Ag and Mg).

In a case in which the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., mixture of Ag and Mg). Alternatively, the second electrode EL2 may have a multilayer structure including a reflective layer or a transflective layer formed of the above materials and a transparent conductive layer formed of ITO, IZO. ZnO, or ITZO.

Although not shown in the drawings, the second electrode EL2 may be connected to an auxiliary electrode. Any material may be used as the auxiliary electrode without limitations as long as it is known in the art. For example, the auxiliary electrode may include Li, Ca, LiF/Ca, LiF/Al. Al, Mg, BaF, Ba, Ag, or a compound or mixture thereof (e.g., mixture of Ag and Mg). In another implementation, the auxiliary electrode may also include ITO. IZO, ZnO, or ITZO. For example, the auxiliary electrode may be connected to the second electrode EL2 to reduce a resistance value of the second electrode EL2.

In a case in which the organic electroluminescent device OEL is a top emission type, the first electrode ELI may be a reflective electrode, and the second electrode EL2 may be a transmissive electrode or a transflective electrode. In a case in which the organic electroluminescent device OEL is a bottom emission type, the first electrode EL1 may be a transmissive electrode or a transflective electrode, and the second electrode EL2 may be a reflective electrode.

In the organic electroluminescent device OEL, when applying voltages respectively to the first electrode EL1 and the second electrode EL2, holes injected from the first electrode EL1 move to the emission layer EML through the hole transport region HTR, and electrons injected from the second electrode EL2 move to the emission layer EML through the electron transport region ETR. The holes and electrons are recombined in the emission layer EML to generate excitons, and light is generated when the excitons drop from an excited state to a ground state.

The capping layer CPL is disposed on the second electrode EL2. The capping layer CPL may control an optical interference distance by adjusting an optical path length of the organic electroluminescent device OEL. The capping layer CPL may protect the organic layer OL from moisture and/or oxygen. Optical characteristics may be provided to the capping layer CPL if necessary, and, for example, the capping layer CPL may also improve light extraction efficiency.

The capping layer CPL may be formed of an organic material which absorbs light having a wavelength of greater than about 380 nm and equal to or less than about 450 nm. The organic material may include, for example, at least one of the following compounds. However, an example embodiment is not limited thereto.

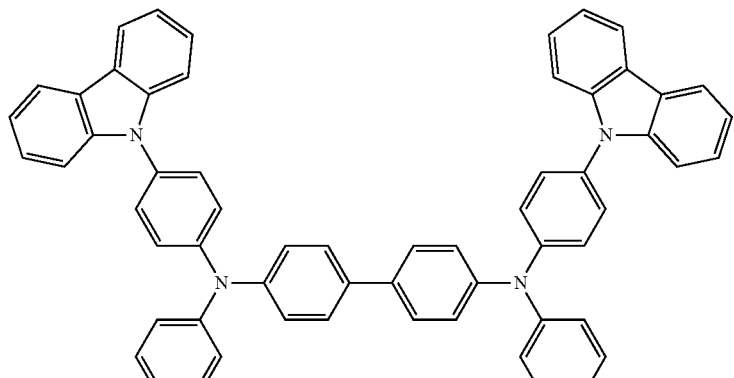
N$^4$,N$^{4'}$-bis(4-(9H-carbazol-9-yl)-N$^4$,N$^{4'}$-diphenyl-[1,1'-biphenyl]-4,4'-diamine
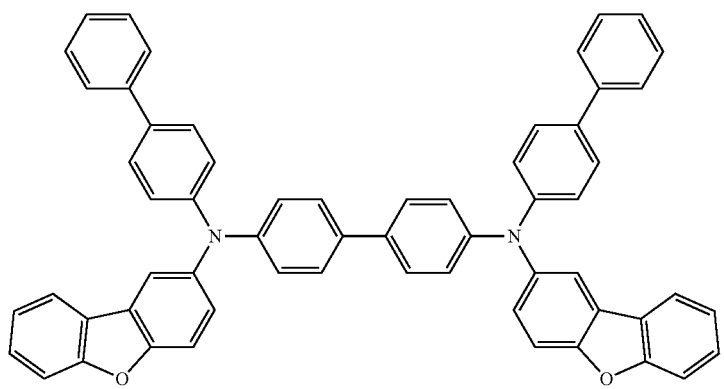
N$^4$,N$^{4'}$-di([1,1'-biphenyl]-4-yl)-N$^4$,N$^{4'}$-bis(dibenzo[b,d]furan-2-yl)-[1,1'-biphenyl]-4,4'-diamine
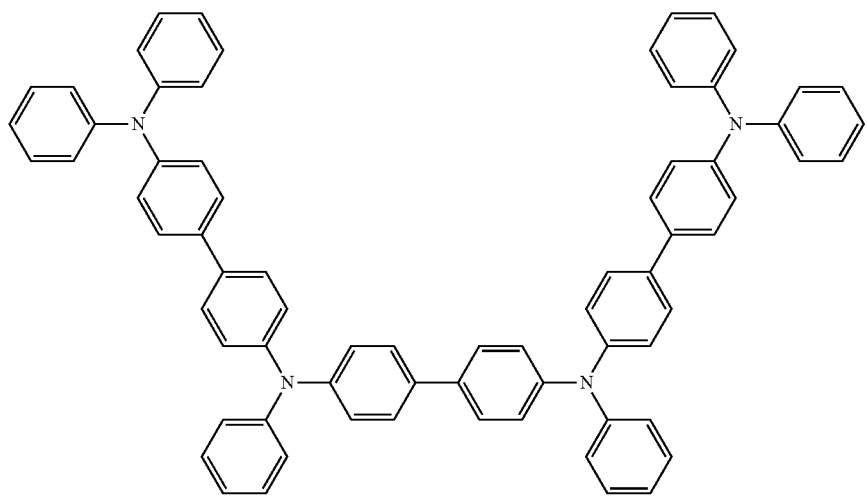
N$^4$,N$^{4'}$-([1,1'-biphenyl]-4,4'-diyl)bis(N$^4$,N$^{4'}$,N$^{4'}$-triphenyl-[1,1'-biphenyl]-4,4'-diamine)

-continued
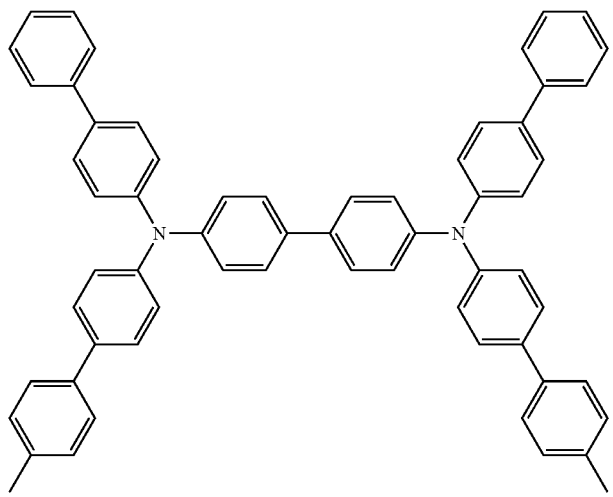
N$^4$,N$^{4'}$-di([1,1'-biphenyl]-4-yl)bis(N$^4$,N$^{4'}$-bis(4'-methyl-[1,1'-biphenyl]-4-yl)-[1,1'-biphenyl]-4,4'-diamine
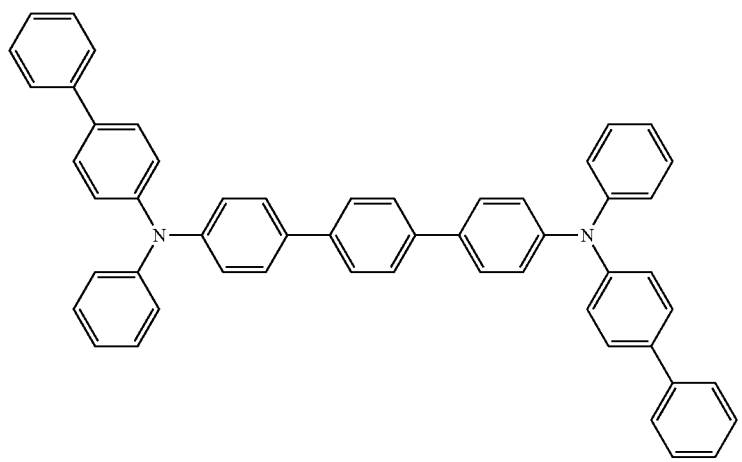
N$^4$,N$^{4''}$-di([1,1'-biphenyl]-4-yl)-N$^4$,N$^{4''}$-diphenyl-[1,1':4'1''-terphenyl]-4,4''-diamine
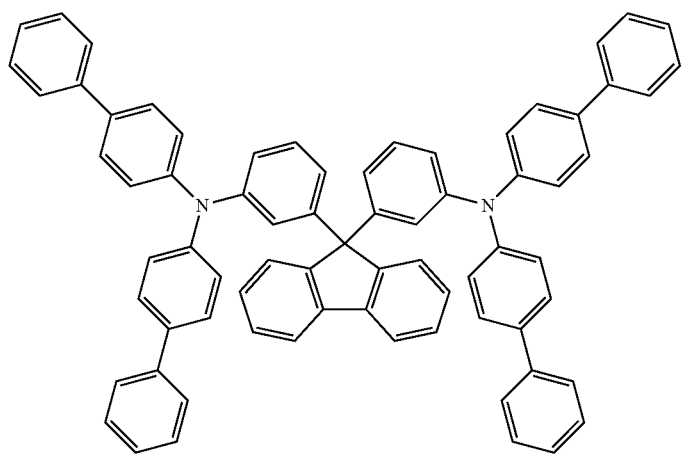
N,N'-((9H-fluorene-9,9-diyl)bis(3,1-phenylene))bis(N-([1,1'-biphenyl]-4-yl)-[1,1'-biphenyl]-4-amine)

The capping layer CPL may include a general capping layer material and a fourth light absorbing dye that absorbs light having a wavelength of greater than about 380 nm and equal to or less than about 450 nm. In this case, the capping layer CPL may include, for example, a transparent organic material such as a polyimide resin, an epoxy resin, or an acryl resin. In another implementation, the capping layer CPL may also include an inorganic material such as silicon oxide, silicon nitride, silicon oxynitride, or a combination thereof, etc.

The fourth light absorbing dye may be the same as or different from the above-described first light absorbing dye. The fourth light absorbing dye may include, for example, benzotriazoles, benzophenones, salicylic acids, salicylates, cyanoacrylates, cinnamates, oxanilides, polystyrenes, polyferrocenylsilanes, methines, azomethines, triazines, para-aminobenzoic acids, cinnamic acids, urocanic acids, or a combination thereof.

The fourth light absorbing dye may absorb light having a wavelength range of about 400 nm to about 450 nm.

The fourth light absorbing dye may be a dye having a maximum absorption wavelength of about 380 to about 410 nm. The fourth light absorbing dye may absorb light having a wavelength range of about 400 nm to about 410 nm.

The capping layer CPL may have a thickness of, for example, about 20 nm to about 200 nm. For example, the capping layer CPL may have a thickness of about 60 nm to about 80 nm. In a case in which the thickness of the capping layer CPL is less than about 20 nm, the capping layer CPL may not generate a smooth resonance effect, and, in a case in which the thickness of the capping layer CPL is greater than about 200 nm, the thickness is may be increased.

A light transmittance in a wavelength range of about 400 nm to about 410 nm of the capping layer CPL may be about 65% or less. A light transmittance at about 405 nm may be about 65% or less. For example, the light transmittance in a wavelength range of about 400 nm to about 410 nm of the capping layer CPL may be about 5% to about 65%. In a case in which the light transmittance is greater than about 65%, the capping layer CPL may block less ultraviolet light and a portion of visible light which are introduced into the organic layer OL, and prevention of degradation of the organic layer OL may be lessened.

A light transmittance in a wavelength range of about 410 nm to about 780 nm of the capping layer CPL may be about 65% to about 100%. In a case in which the light transmittance is about 65% or less, efficiency of blue light emitted from the emission layer EML may be reduced.

A light transmittance in a wavelength range of greater than about 380 nm and equal to or less than about 400 nm of the capping layer CPL may be about 5% or less, etc. For example, the light transmittance in a wavelength range of greater than about 380 nm and equal to or less than about 400 nm of the capping layer CPL may be about 0% to about 5%.

The light transmittance of the capping layer CPL may be measured by a suitable method known in the art. For example, the capping layer CPL having a thickness of about 70 nm is disposed on a silicon substrate, and the light transmittance of the capping layer CPL may then be measured using, for example, a Cary 100 UV-Vis by Agilent Technologies or F10-RT-UV by FILMETRICS INC.

An encapsulation layer SL is disposed on the capping layer CPL. The encapsulation layer SL may cover layers disposed thereunder. For example, the encapsulation layer SL may cover both sides of the first electrode ELL the organic layer OL, the second electrode EL2, and the capping layer CPL. However, an example embodiment is not limited thereto.

The encapsulation layer SL may include glass. The encapsulation layer SL may be formed of glass. In another implementation, the encapsulation layer SL may include at least one of an organic material and an inorganic material. The encapsulation layer SL may include, for example, a plurality of inorganic layers and a plurality of organic layers which are alternatingly stacked. The plurality of inorganic layers may be a single layer or laminated layer including metal oxide or metal nitride. For example, the plurality of inorganic layers may include any one of $SiN_x$, $Al_2O_3$, $SiO_2$, and $TiO_2$. The plurality of organic layers may relieve internal stress of the inorganic layers and may compensate and planarize defects of the inorganic layers. Each of the plurality of organic layers is formed of a polymer and may be a single layer or laminated layer formed of any one of polyethylene terephthalate, polyimide, polycarbonate, epoxy, polyethylene, and polyacrylate.

The organic electroluminescent device OEL included in the display device 10 according to an example embodiment may have a structure of first hole transport layer/second hole transport layer/emission layer/first electron transport layer/second electron transport layer/electron injection layer/second electrode/capping layer/encapsulation layer which are sequentially stacked from the first electrode EL1, etc.

Generally, an organic layer included in a display panel may be degraded by ultraviolet light and a portion of visible light generated from the outside, and this may cause a pixel shrinkage phenomenon, which may lead to a decrease in light-emitting area of the display panel and, as a result, efficiency of the display panel may be decreased and brightness may be reduced. Also, the degradation of the organic layer may causes changes in color temperature of the display panel.

According to embodiments, in the display device 10, degradation of the display panel due to ultraviolet light and a portion of visible light may be reduced or prevented by the functional layer configured to absorb the ultraviolet light and the portion of visible light in the polarization member 100 which is disposed on the display panel 200. The display device 10 according to an example embodiment may improve reliability and the reduction of brightness by minimizing the pixel shrinkage through the suppression of the degradation of the display panel 200 due to the external light, and may minimize or eliminate changes in color temperature.

A degree of the degradation of the organic layer OL due to ultraviolet light and a portion of visible light may be different depending on a material of the organic layer OL. The display device 10 according to an example embodiment blocks ultraviolet light and a portion of visible light at the top of the display panel 200 to suppress the degradation of the display panel 200 regardless of the material of the organic layer OL.

Hereinafter, a display device according to an example embodiment will be described. Hereinafter, points different from the above-described display device according to an example embodiment will be mainly described in detail, and undescribed parts will be appreciated referring to the description of the above-described display device according to an example embodiment.

Referring again to FIG. 1, a display device 10 according to an example embodiment includes a display panel 200 and a polarization member 100 disposed on the display panel 200. The polarization member 100 includes a fifth light absorbing dye that absorbs ultraviolet light and a portion of visible light. The polarization member 100 includes the fifth light absorbing dye that absorbs light having a wavelength of greater than about 380 nm and equal to or less than about 450 nm.

The fifth light absorbing dye may be the same as or different from the above-described first light absorbing dye. The descriptions of the first light absorbing dye are equally applicable to descriptions of the fifth light absorbing dye.

Referring to FIGS. 1 and 6, a light transmittance in a wavelength range of about 380 nm to about 780 nm of the polarization member 100 may be different for each wavelength. A light transmittance in a wavelength range of greater than about 380 nm and equal to or less than about 400 nm of the polarization member 100 may be about 5% or less. The light transmittance in a wavelength range of greater than about 380 nm and equal to or less than about 400 nm of the polarization member 100 may be about 0% to about 5%, and it is desirable to have a lower light transmittance in the above wavelength range. For example, the light transmittance in a wavelength range of greater than about 380 nm and equal to or less than about 400 nm of the polarization member 100 may be about 3% or less, about 2% or less, about 1% or less, or about 0.5% or less.

A light transmittance in a wavelength range of about 400 nm to about 410 nm of the polarization member 100 may be about 65% or less. The light transmittance in a wavelength range of about 400 nm to about 410 nm of the polarization member 100 may be about 5% to about 65%, and it is desirable to have a lower light transmittance in the above wavelength range.

A light transmittance in a wavelength range of about 410 nm to about 780 nm of the polarization member 100 may be about 65% to about 100%, and it is desirable to have a higher light transmittance in the above wavelength range.

Referring to FIGS. 7 to 9, the display device 10 according to an example embodiment may further include a fourth adhesive layer 300 or 600 disposed on at least one surface of the polarization member.

The fourth adhesive layer 300 or 600 may include a sixth light absorbing dye that absorbs light having a wavelength of greater than about 380 nm and equal to or less than about 450 nm. In another implementation, the fourth adhesive layer 300 or 600 may perform an adhesive function without including the sixth light absorbing dye.

The sixth light absorbing dye may be the same as the fifth light absorbing dye, etc., and the sixth light absorbing dye may be different from the fifth light absorbing dye. The descriptions of the fifth light absorbing dye are equally applicable to descriptions of the sixth light absorbing dye.

The fourth adhesive layer 300 or 600 may function as a double-sided adhesive layer. The fourth adhesive layer 300 or 600 may include, for example a urethane-based adhesive, a fluorine-based adhesive, an epoxy-based adhesive, a polyester-based adhesive, a polyamide-based adhesive, an acryl-based adhesive, a silicon-based adhesive or a combination thereof, etc. For example, the fourth adhesive layer 300 or 600 may be the acryl-based adhesive or silicon-based adhesive.

The adhesive included in the fourth adhesive layer 300 or 600 may be, for example, an active energy ray-curing adhesive, a solvent-type (solution-type) adhesive, a hot melt-type adhesive, or an emulsion-type adhesive. For example, the fourth adhesive layer 300 or 600 may include an adhesive such as an optically clear adhesive (OCA), or may include an adhesive such as an optically clear resin (OCR).

The fourth adhesive layer 300 or 600 may absorb light having a wavelength of greater than about 380 nm and equal to or less than about 450 nm. A light transmittance in a wavelength range of greater than about 380 nm and equal to or less than about 400 nm of the fourth adhesive layer 300 or 600 may be about 5% or less, and a light transmittance in a wavelength range of about 400 nm to about 410 nm of the fourth adhesive layer 300 or 600 may be about 65% or less. The light transmittance in a wavelength range of greater than about 380 nm and equal to or less than about 400 nm of the fourth adhesive layer 300 or 600 may be about 0% to about 5%, and the light transmittance in a wavelength range of about 400 nm to about 410 nm of the fourth adhesive layer 300 or 600 may be about 5% to about 65%.

A light transmittance in a wavelength range of about 410 nm to about 780 nm of the fourth adhesive layer 300 or 600 may be about 65% to about 100%, and it is desirable to have a higher light transmittance in the above wavelength range.

Hereinafter, a display device according to an example embodiment will be described. Hereinafter, points different from the above-described display device according to an example embodiment will be mainly described in detail, and undescribed parts will be appreciated referring to the description of the above-described display device according to an example embodiment.

Referring again to FIGS. 1, 3, and 16, a display device according to an example embodiment includes a display panel 200 and a polarization member 100 disposed on the display panel 200. The display panel 100 may include a first electrode ELl, an organic layer OL (which is disposed on the first electrode EL1 and includes an emission layer EML). a second electrode EL2 disposed on the organic layer OL, a capping layer CPL disposed on the second electrode EL2, and an encapsulation layer SL disposed on the capping layer CPL. The polarization member 100 includes a polarizer 110 and a plurality of functional layers 120 disposed on at least one surface of the polarizer 110. At least one of the plurality of functional layers 120 or the capping layer CPL respectively include a seventh light absorbing dye that absorbs light having a wavelength of greater than about 380 nm and equal to or less than about 450 nm.

The descriptions of the first light absorbing dye are equally applicable to descriptions of the seventh light absorbing dye.

The display device 10 according to the present example embodiment may block ultraviolet light generated from the outside and a portion of visible light at the polarization member 100 disposed on the top of the display panel 200 to suppress the degradation of the display panel 200. Thus, the display device 10 may improve reliability by suppressing the pixel shrinkage phenomenon, may minimize the reduction of brightness, and may reduce the changes in color temperature.

Hereinafter, a display device according to an example embodiment will be described. Hereinafter, points different from the above-described display device according to an example embodiment will be mainly described in detail, and undescribed parts will be appreciated referring to the description of the above-described display device according to an example embodiment.

Referring again to FIGS. 9 to 12, an example embodiment provides the display device which includes a display panel 200, a polarization member 100, a touch sensing unit 400, a window member 500, and one or more adhesive layers 600. The polarization member 100 and the touch sensing unit 400 are disposed on the display panel 200. The window member 500 is disposed on the polarization member 100 and the touch sensing unit 400. The one or more adhesive layers 600 are disposed between the display panel 20 and the window member 500. At least one of the one or more adhesive layers 600 includes an eighth light absorbing dye that absorbs light having a wavelength of greater than about 380 nm and equal to or less than about 450 nm. Descriptions of the first light absorbing dye are equally applicable to the eighth light absorbing dye.

The touch sensing unit 400 may be disposed on the polarization member 100. One of the one or more adhesive layers 600 may be disposed between the touch sensing unit 400 and the polarization member 100, and the touch sensing unit 400 and the polarization member 100 may be in contact with each other.

Referring to FIG. 10, the one or more adhesive layers 600 may include the first sub-adhesive layer 610 disposed between the polarization member 100 and the touch sensing unit 400 and the second sub-adhesive layer 620 disposed between the touch sensing unit 400 and the window member 500. At least one of the first sub-adhesive layer 610 or the second sub-adhesive layer 620 includes the eighth light absorbing dye.

Referring to FIG. 11, the polarization member 100 may be disposed on the touch sensing unit 400, and the touch sensing unit 400 may be directly disposed on the display panel 200. The one or more adhesive layers 600 may include the first sub-adhesive layer 600 disposed between the polarization member 100 and the window member 500, and the first sub-adhesive layer 600 may include the eighth light absorbing dye. In another implementation, for example, the one or more adhesive layers 600 may include a second sub-adhesive layer disposed between the polarization member 100 and the touch sensing unit 400.

Referring to FIG. 12, the polarization member 100 may be disposed on the touch sensing unit 400, the one or more adhesive layers 600 may include the first sub-adhesive layer 610 disposed between the display panel 200 and the touch sensing unit 400 and the second sub-adhesive layer 620 disposed between the polarization member 100 and the window member 500. At least one of the first sub-adhesive layer 610 or the second sub-adhesive layer 620 may include the eighth light absorbing dye.

The adhesive layer including the eighth light absorbing dye among the one or more adhesive layers 600 may have a light transmittance in a wavelength range of greater than about 380 nm and equal to or less than about 400 nm of about 5% or less, a light transmittance in a wavelength range of greater than about 400 nm and equal to or less than about 410 nm of about 65% or less, and a light transmittance in a wavelength range of greater than about 410 nm and equal to or less than about 780 nm of greater than about 65% to less than about 100%.

Referring to FIG. 16, as described above, the display panel 200 may include the first electrode EL1, the organic layer OL which is disposed on the first electrode EL1 and includes the emission layer EML, the second electrode EL2 disposed on the organic layer OL, and the capping layer CPL disposed on the second electrode EL2, wherein the capping layer CPL may include a ninth light absorbing dye which absorbs light having a wavelength range of greater than about 380 nm and equal to or less than about 450 nm. Descriptions of the first light absorbing dye are equally applicable to the ninth light absorbing dye. The ninth light absorbing dye may be the same or different from the eighth light absorbing dye.

The display device 10 according to the present example embodiment may block ultraviolet light generated from the outside and a portion of visible light at the adhesive layer 600 disposed on the top of the display panel 200 to suppress the degradation of the display panel 200. Thus, the display device 10 may improve reliability by suppressing the pixel shrinkage phenomenon, may minimize the reduction of brightness, and may reduce the changes in color temperature.

Hereinafter, a display device according to an example embodiment will be described. Hereinafter, points different from the above-described display device according to example embodiments will be mainly described in detail, and undescribed parts will be appreciated referring to the description of the above-described display device.

FIG. 19 is a schematic cross-sectional view illustrating a display device according to an example embodiment. FIG. 20 is a schematic cross-sectional view illustrating a display device according to an example embodiment.

Referring to FIGS. 19 and 20, different from the above-described display device, a display device 10 according to the present example embodiment may not include a polarization member (e.g., 100 of FIG. 1). The display device 10 according to the present example embodiment may include a color filter layer 700 disposed on a display panel 200.

The color filter layer 700 may include a first sub-color filter layer 700-R, a second sub-color filter layer 700-G, and a third sub-color filter layer 700-B which are disposed in a first direction DR1. For example, the first sub-color filter layer 700-R may be a red color filter layer, the second sub-color filter layer 700-G may be a green color filter layer, and the third sub-color filter layer 700-B may be a blue color filter layer. A black matrix BM may be disposed between the first sub-color filter layer 700-R and the second sub-color filter layer 700-G, and the black matrix BM may be disposed between the second sub-color filter layer 700-G and the third sub-color filter layer 700-B. The color filter layer 700 and the black matrix BM may be disposed on the same layer.

In order to prevent external light incident on the display panel 200 from being reflected and visible to a user, the color filter layer 700 and the black matrix BM function to prevent the incident light from being reflected and emitted.

As illustrated in FIG. 19, the color filter layer 700 may be disposed, for example, between the display panel 200 and the touch sensing unit 400. Referring to FIG. 20, the color filter layer 700 may be disposed on the touch sensing unit 400, and, for example, may be disposed between the touch sensing unit 400 and the window member 500.

The color filter layer 700 may include a tenth light absorbing dye which absorbs light having a wavelength range of greater than about 380 nm and equal to or less than about 450 nm. Since descriptions of the tenth light absorbing dye are the same as the descriptions of the first light absorbing dye, the descriptions thereof will be omitted. For example, at least one of the first sub-color filter layer 700-R, the second sub-color filter layer 700-G, or the third sub-color filter layer 700-B may include the tenth light absorbing dye.

The color filter layer 700 may further include an overcoat layer which is disposed on the first sub-color filter layer 700-R, the second sub-color filter layer 700-G, and the third sub-color filter layer 700-B, and the tenth light absorbing dye may be included in the overcoat layer.

The touch sensing unit 400 may include a first sensing electrode, a second sensing electrode, and an insulating layer disposed between the first sensing electrode and the second sensing electrode, and the insulating layer may include an eleventh light absorbing dye which absorbs light having a wavelength range of greater than about 380 nm and equal to or less than about 450 nm. Since descriptions of the eleventh light absorbing dye are the same as the descriptions of the first light absorbing dye, the descriptions thereof will be omitted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Two or more of Tinuvin Carboprotect (light absorbing dye A), Tinuvin 1130 (light absorbing dye B). and Tinuvin 326 (light absorbing dye C) by BASF SE were mixed as a first light absorbing dye to prepare polarizing members of Examples 1 to 3.

Figure 17A:
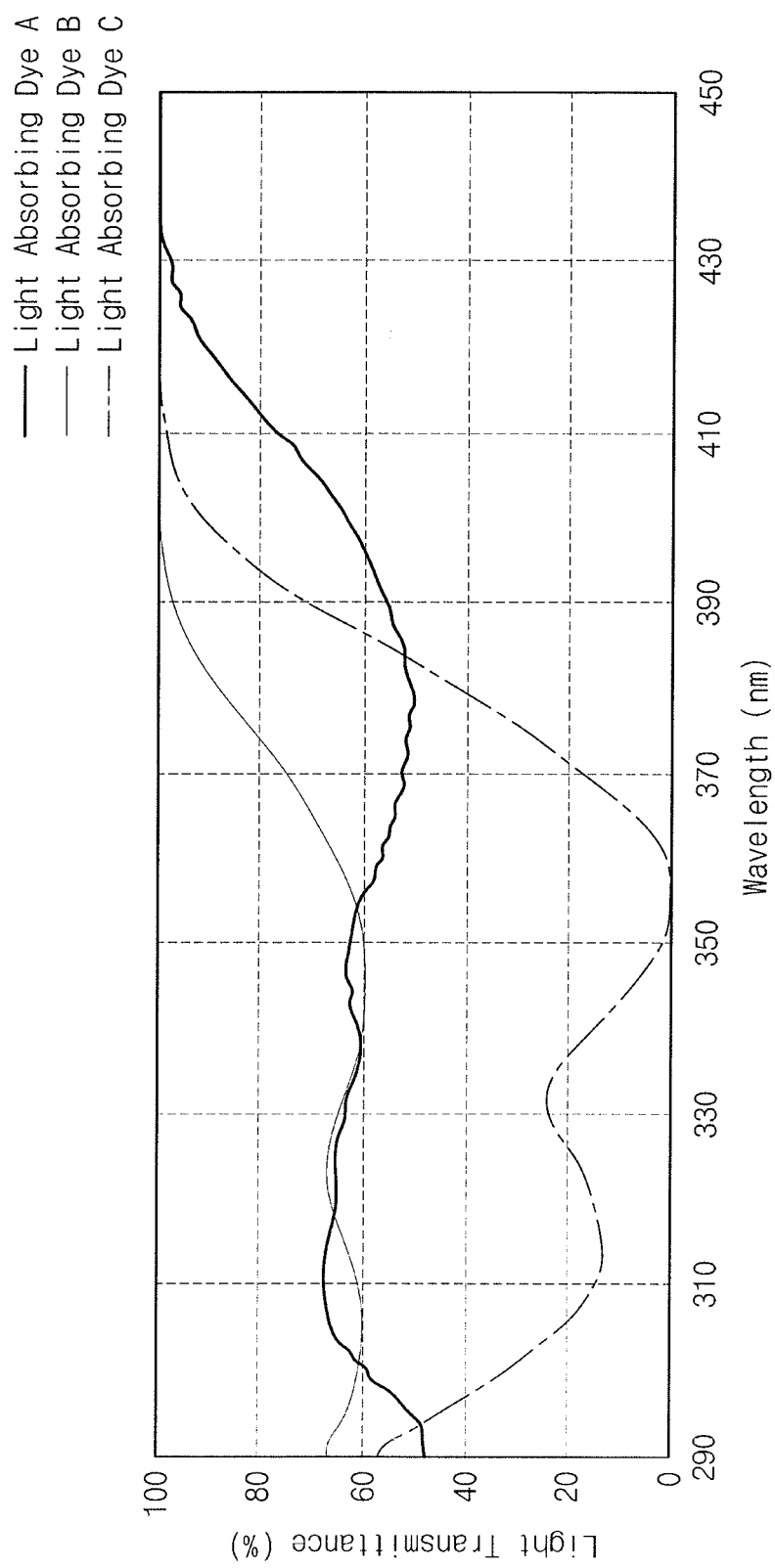
FIG. 17A is a graph illustrating light transmittance versus optical wavelength of light absorbing dyes which may be included in the display device according to an example embodiment.

FIG. 17A is a graph of light transmittance versus optical wavelength for each of the light absorbing dyes A to C.

1. Example 1

Example 1 is a polarizing member including a first adhesive layer which is formed by using a composition in which about 20 mg of Tinuvin 1130 and about 200 mg of Tinuvin 326 were added to 1 L of a toluene solvent.

2. Example 2

Example 2 is a polarizing member including a first adhesive layer which is formed by using a composition in which about 20 mg of Tinuvin 1130 and about 400 mg of Tinuvin 326 were added to 1 L of a toluene solvent.

3. Example 3

Example 3 is a polarizing member including a first adhesive layer which is formed by using a composition in which about 10 mg of Tinuvin Carboprotect, about 20 mg of Tinuvin 1130, and about 500 mg of Tinuvin 326 were added to 1 L of a toluene solvent.

Figure 17B:
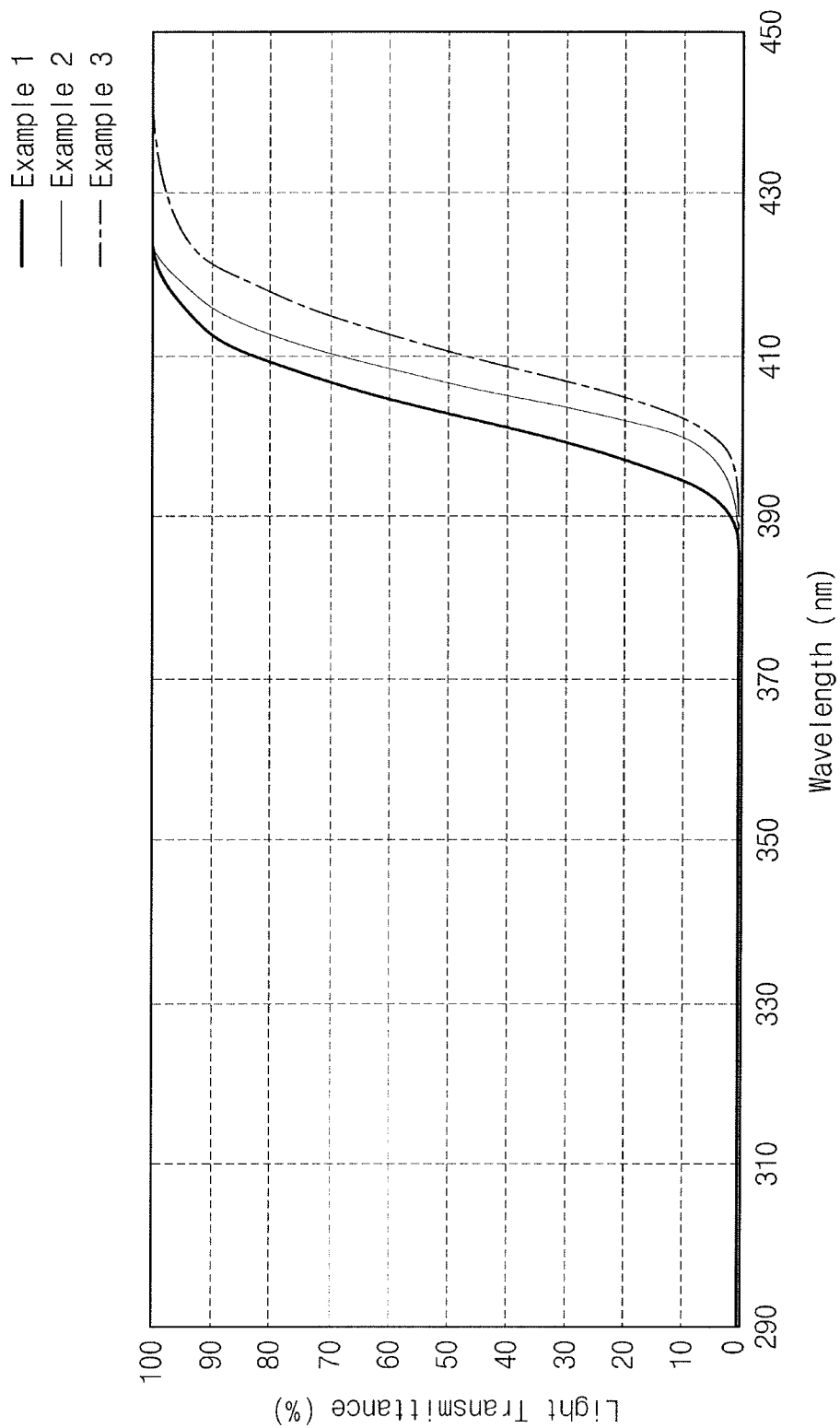
FIG. 17B is a graph illustrating light transmittance versus optical wavelength according to Examples 1 to 3.

FIG. 17B is a graph of light transmittance versus optical wavelength for each of Examples 1 to 3. From the result of FIG. 17B, it may be understood that an effect of absorbing light having a wavelength of greater than about 380 nm and equal to or less than about 450 nm may be obtained by appropriately combining the light absorbing dyes. In another implementation, the effect of absorbing light having a wavelength of greater than about 380 nm and equal to or less than about 450 nm may be obtained by using the single light absorbing dye alone.

With respect to Example 3, a light transmittance in a wavelength range of greater than about 380 nm and equal to or less than about 400 nm was about 5% or less, a light transmittance in a wavelength range of about 400 nm to about 410 nm was about 65% or less, and a light transmittance in a wavelength range of about 410 nm to about 780 nm satisfied a range of about 65% to about 100%. From the above result, it may be understood that the light transmittance targeted for each wavelength range may be adjusted by appropriately combining the light absorbing dyes.

EXPERIMENTAL EXAMPLE

4. Example 4

A polarization member including a first adhesive layer, which included a dye configured to absorb light having a wavelength range of about 380 to about 410 nm, was prepared as Example 4.

Comparative Example 1

Comparative Example 1 is a polarization member including an adhesive layer which included a dye configured to absorb light having a wavelength of about 380 nm or less.

The occurrence of pixel shrinkage for each of red pixel, green pixel, and blue pixel was observed by irradiating each of Example 4 and Comparative Example 1 with light having a wavelength of about 410 nm or less (ultraviolet light and portion of visible light). The results thereof are presented in FIG. 13.

Figure 18:
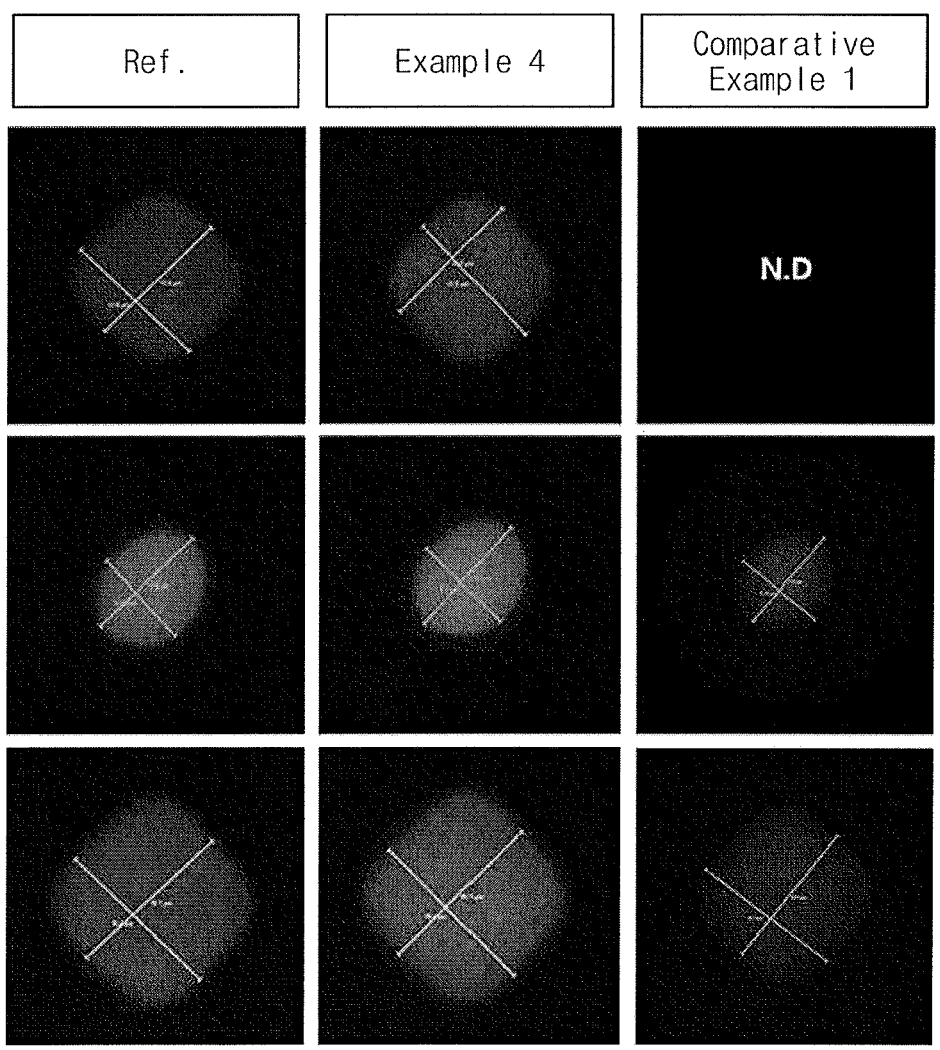
FIG. 18 is images showing the presence of pixel shrinkage in Example 4.

The "Ref" of FIG. 18 represents the result of a case in which the polarization member according to Comparative Example 1 was not irradiated with ultraviolet light and a portion of visible light. In FIG. 18, a pixel illustrated at the top was the red pixel, a pixel illustrated in the middle was the green pixel, and a pixel illustrated at the bottom was the blue pixel. The "N.D." in FIG. 18 denotes a case in which a light-emitting region was not observed due to pixel shrinkage.

Referring to FIG. 18, with respect to a case of Example 4 in which the polarization member including the first adhesive layer, which included a dye configured to absorb light having a wavelength range of about 380 to about 410 nm, was disposed on the display panel, pixel shrinkage did not occur, but, with respect to Comparative Example 1 in which the polarization member including the adhesive layer, which included a dye configured to absorb light having a wavelength of about 380 nm or less, was disposed on the display panel, it may be understood that pixel shrinkage occurred. From the above result, it may be understood that the display device according to an example embodiment may prevent the degradation of the display panel due to external light by providing the polarizing member including an adhesive layer, which may block the external light capable of generating the degradation of the display panel, to the top of the display panel.

By way of summation and review, research has been conducted towards blocking ultraviolet light and a portion of visible light generated from the outside to help prevent degradation of a display panel included in a display device by external light.

As described above, embodiments relate to a polarization member and display devices that block ultraviolet light and a portion of visible light generated from the outside.

According to a display device according to an example embodiment, degradation of a display panel may be minimized by blocking ultraviolet light and a portion of visible light generated from the outside.

According to the display device according to an example embodiment, a reduction in brightness may be suppressed by minimizing pixel shrinkage due to ultraviolet light and a portion of visible light.

According to the display device according to an example embodiment, changes in color temperature due to ultraviolet light and a portion of visible light may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel; and
a polarization member on the display panel, the polarization member including:
a polarizer; and
a plurality of functional layers on at least one surface of the polarizer, at least one of the plurality of functional layers including a light absorbing dye that absorbs light having a wavelength of greater than about 380 nm and equal to or less than about 450 nm, wherein
the light absorbing dye includes at least two benzotriazole derivatives, the at least two benzotriazole derivatives are different from each other, and the at least two benzotriazole derivatives cause the light-absorbing dye to have a light transmittance in a wavelength range of greater than about 380 nm and equal to or less than about 400 nm of about 5% or less, and
one of at least two benzotriazole derivatives has a maximum absorption wavelength in the range of 350 nm to 360 nm, and the other of at least two benzotriazole derivatives has a maximum absorption wavelength in the range of 340 nm to 350 nm and 300 nm to 310 nm.

2. The display device as claimed in claim 1, wherein the plurality of functional layers includes at least one of a $\lambda/4$ retardation layer, a $\lambda/2$ retardation layer, a protective film, an antireflection layer, a hard coating layer, a brightness enhancement film, an adhesive layer, or a surface treatment layer.

3. The display device of claim 2, wherein the adhesive layer includes the light absorbing dye.

4. The display device of claim 2, wherein:
the plurality of functional layers includes the $\lambda/4$ retardation layer, the $\lambda/2$ retardation layer, and the adhesive layer,
the $\lambda/2$ retardation layer and the adhesive layer are disposed between the polarizer and the $\lambda/4$ retardation layer, and
the adhesive layer includes the light absorbing dye.

5. The display device of claim 4, wherein the adhesive layer is disposed between the $\lambda/4$ retardation layer and the $\lambda/2$ retardation layer.

6. The display device of claim 4, wherein the adhesive layer is disposed between the polarizer and the $\lambda/2$ retardation layer.

7. The display device as claimed in claim 1, wherein the at least two benzotriazole derivatives cause the light-absorbing dye to have a light transmittance in a wavelength range of about 400 nm to about 410 nm of about 65% or less.

8. The display device as claimed in claim 1, wherein the at least two benzotriazole derivatives cause the light-absorbing dye to have a light transmittance in a wavelength range of about 410 nm to about 780 nm of about 65% to about 100%.

9. The display device as claimed in claim 1, further comprising a second adhesive layer disposed between the display panel and the polarization member, the second adhesive layer including a second light absorbing dye that absorbs light having a wavelength of greater than about 380 nm and equal to or less than about 450 nm.

10. The display device as claimed in claim 9, wherein the second light absorbing dye is the same as the light absorbing dye.

11. The display device as claimed in claim 9, wherein the second adhesive layer has a light transmittance in a wavelength range of greater than about 380 nm and equal to or less than about 400 nm of about 5% or less, and has a light transmittance in a wavelength range of about 400 nm to about 410 nm of about 65% or less.

12. The display device as claimed in claim 9, wherein the second adhesive layer has a light transmittance in a wavelength range of about 410 nm to about 780 nm of about 65% to about 100%.

13. The display device of claim 9, further comprising a touch sensing unit disposed between the display panel and the polarization member,
wherein the second adhesive layer is disposed between the display panel and the touch sensing unit.

14. The display device as claimed in claim 1, further comprising:
a window member on the polarization member; and
a third adhesive layer disposed between the polarization member and the window member, the third adhesive layer including a third light absorbing dye that absorbs light having a wavelength of greater than about 380 nm and equal to or less than about 450 nm.

15. The display device as claimed in claim 14, wherein the third light absorbing dye is the same as the light absorbing dye.

16. The display device as claimed in claim 14, wherein the third adhesive layer has a light transmittance in a wavelength range of greater than about 380 nm and equal to or less than about 400 nm of about 5% or less, and has a light transmittance in a wavelength range of about 400 nm to about 410 nm of about 65% or less.

17. The display device as claimed in claim 14, wherein the third adhesive layer has a light transmittance in a wavelength range of about 410 nm to about 780 nm of about 65% to about 100%.

18. The display device of claim 14, further comprising a touch sensing unit disposed between the polarization member and the window member, wherein:
the third adhesive layer includes a first sub-adhesive layer disposed between the polarization member and the touch sensing unit and a second sub-adhesive layer disposed between the touch sensing unit and the window member, and
at least one of the first sub-adhesive layer or the second sub-adhesive layer includes the third light absorbing dye.

19. The display device of claim 14, further comprising a touch sensing unit disposed between the display panel and the polarization member,
wherein the touch sensing unit is directly disposed on the display panel.

20. The display device as claimed in claim 1, wherein the display panel includes:
a first electrode;
an organic layer that is on the first electrode and includes an emission layer;
a second electrode on the organic layer;

a capping layer on the second electrode; and an encapsulation layer on the capping layer, wherein the capping layer includes another light absorbing dye, which absorbs light having a wavelength of greater than about 380 nm and equal to or less than about 450 nm, or an organic material.

21. The display device as claimed in claim 20, wherein the encapsulation layer includes glass.

22. The display device as claimed in claim 20, wherein the capping layer has a light transmittance in a wavelength range of about 400 nm to about 410 nm of about 65% or less.

23. The display device as claimed in claim 20, wherein the capping layer has a light transmittance in a wavelength range of about 410 nm to about 780 nm of about 65% to about 100%.

24. A display device, comprising:

a display panel; and a polarization member on the display panel, the polarization member including a light absorbing dye that absorbs light having a wavelength of greater than about 380 nm and equal to or less than about 450 nm, wherein the light absorbing dye includes at least two benzotriazole derivatives, the at least two benzotriazole derivatives are different from each other, and the at least two benzotriazole derivatives cause the polarization member to have a light transmittance in a wavelength range of greater than about 380 nm and equal to or less than about 400 nm of about 5% or less, and one of at least two benzotriazole derivatives has a maximum absorption wavelength in the range of 350 nm to 360 nm, and the other of at least two benzotriazole derivatives has a maximum absorption wavelength in the range of 340 nm to 350 nm and 300 nm to 310 nm.

25. The display device as claimed in claim 24, wherein the at least two benzotriazole derivatives cause the polarization member to have a light transmittance in a wavelength range of about 400 nm to about 410 nm of about 65% or less.

26. The display device as claimed in claim 24, wherein the at least two benzotriazole derivatives cause the polarization member to have a light transmittance in a wavelength range of about 410 nm to about 780 nm of about 65% to about 100%.

27. The display device as claimed in claim 24, further comprising an adhesive layer on at least one surface of the polarization member, the adhesive layer including another light absorbing dye having at least two benzotriazole derivatives that absorbs light having a wavelength of greater than about 380 nm and equal to or less than about 450 nm.

28. The display device as claimed in claim 27, wherein the another light absorbing dye is the same as the light absorbing dye for the polarization layer.

29. The display device as claimed in claim 27, wherein the adhesive layer has a light transmittance in a wavelength range of about 400 nm to about 410 nm of about 65% or less.

30. The display device as claimed in claim 27, wherein the adhesive layer has a light transmittance in a wavelength range of about 410 nm to about 780 nm of about 65% to about 100%.

31. A display device, comprising:

a display panel, the display panel including:

a first electrode;

an organic layer that is on the first electrode and includes an emission layer;

a second electrode on the organic layer;

a capping layer on the second electrode; and an encapsulation layer on the capping layer, and a polarization member on the display panel, the polarization member including:

a polarizer; and a plurality of functional layers on at least one surface of the polarizer, wherein at least one of the plurality of functional layers or the capping layer includes a light absorbing dye that absorbs light having a wavelength of greater than about 380 nm and equal to or less than about 450 nm, and wherein the light absorbing dye includes at least two benzotriazole derivatives, the at least two benzotriazole derivatives are different from each other, and the least two benzotriazole derivatives cause the light-absorbing dye to have a light transmittance in a wavelength range of greater than about 380 nm and equal to or less than about 400 nm of about 5% or less, and one of at least two benzotriazole derivatives has a maximum absorption wavelength in the range of 350 nm to 360 nm, and the other of at least two benzotriazole derivatives has a maximum absorption wavelength in the range of 340 nm to 350 nm and 300 nm to 310 nm.

* * * * *